(12) United States Patent
Korikawa

(10) Patent No.: US 10,932,390 B2
(45) Date of Patent: Feb. 23, 2021

(54) IMMERSION TANK AND IMMERSION COOLING DEVICE

(71) Applicant: FUJITSU LIMITED, Kawasaki (JP)

(72) Inventor: Masayuki Korikawa, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/784,298

(22) Filed: Feb. 7, 2020

(65) Prior Publication Data

US 2020/0281093 A1 Sep. 3, 2020

(30) Foreign Application Priority Data

Feb. 28, 2019 (JP) ............................. JP2019-035982

(51) Int. Cl.
*H05K 7/20* (2006.01)
*F25D 25/00* (2006.01)

(52) U.S. Cl.
CPC ......... *H05K 7/20236* (2013.01); *F25D 25/00* (2013.01)

(58) Field of Classification Search
CPC ........... H05K 7/20236; H05K 7/20272; H05K 7/203; H05K 7/20327; H05K 7/20818; H05K 7/20781; H05K 7/20; H01L 23/433; H01L 23/44; H01L 23/4332; F28D 1/0213; F28D 2021/0028; F28F 27/02; F28F 9/005; F28F 2265/10; G06F 1/20

See application file for complete search history.

(56) References Cited

U.S. PATENT DOCUMENTS

| | | | | |
|---|---|---|---|---|
| 3,993,123 A | * | 11/1976 | Chu | H01L 23/373 165/80.3 |
| 4,138,692 A | * | 2/1979 | Meeker | H01L 23/4332 165/80.4 |
| 4,557,514 A | * | 12/1985 | Cushman | B65G 47/91 248/362 |
| 4,750,086 A | * | 6/1988 | Mittal | H01L 23/4332 165/908 |
| 4,759,403 A | * | 7/1988 | Flint | H01L 23/4332 165/80.4 |
| 4,949,219 A | * | 8/1990 | Moriizumi | H01L 23/10 165/185 |
| 4,951,740 A | * | 8/1990 | Peterson | F28D 15/046 165/104.26 |
| 5,195,020 A | * | 3/1993 | Suzuki | H01L 23/4332 257/714 |
| 5,206,791 A | * | 4/1993 | Novotny | H01L 23/427 165/185 |

(Continued)

FOREIGN PATENT DOCUMENTS

JP 2018-010980 A 1/2018

*Primary Examiner* — Binh B Tran
*Assistant Examiner* — Michael A Matey
(74) *Attorney, Agent, or Firm* — Fujitsu Patent Center

(57) ABSTRACT

An immersion tank includes a tank main body configured to store a coolant, at least one first air bag that is provided in the tank main body, that is coupled to a bottom portion of the tank main body, that is able to be inflated toward an upper portion of the tank main body, and that is able to be deflated, from an inflated state thereof, toward the bottom portion, and a guide member that is provided outside the at least one first air bag in the tank main body and that is configured to guide the at least one first air bag during the inflation and the deflation of the at least one first air bag.

10 Claims, 21 Drawing Sheets

(56) References Cited

U.S. PATENT DOCUMENTS

| | | | | |
|---|---|---|---|---|
| 5,324,597 | A * | 6/1994 | Leadbetter | H01M 10/6563 |
| | | | | 429/120 |
| 5,365,402 | A * | 11/1994 | Hatada | H01L 23/3677 |
| | | | | 165/80.4 |
| 5,847,366 | A * | 12/1998 | Grunfeld | G01K 1/143 |
| | | | | 219/497 |
| 7,100,389 | B1 * | 9/2006 | Wayburn | F25D 19/006 |
| | | | | 324/750.08 |
| 7,385,821 | B1 * | 6/2008 | Feierbach | H01L 23/4332 |
| | | | | 165/104.33 |
| 2015/0060009 | A1 * | 3/2015 | Shelnutt | H05K 7/20809 |
| | | | | 165/11.1 |
| 2015/0188297 | A1 * | 7/2015 | Boe | H02B 1/28 |
| | | | | 174/564 |
| 2017/0295670 | A1 * | 10/2017 | Campbell | H05K 7/20236 |
| 2018/0020570 | A1 * | 1/2018 | Fujiwara | H05K 7/20418 |
| 2018/0042138 | A1 * | 2/2018 | Campbell | H05K 7/203 |
| 2018/0063991 | A1 * | 3/2018 | Hirai | H05K 7/20236 |
| 2019/0357385 | A1 * | 11/2019 | Miyazaki | F28F 9/005 |
| 2020/0029464 | A1 * | 1/2020 | Inano | F28F 23/02 |
| 2020/0037467 | A1 * | 1/2020 | Ishinabe | H05K 7/20236 |
| 2020/0163252 | A1 * | 5/2020 | Tung | H05K 7/203 |

\* cited by examiner

IMMERSION TANK AND IMMERSION COOLING DEVICE

CROSS-REFERENCE TO RELATED APPLICATION

This application is based upon and claims the benefit of priority of the prior Japanese Patent Application No. 2019-35982, filed on Feb. 28, 2019, the entire contents of which are incorporated herein by reference.

FIELD

The embodiments discussed herein are related to an immersion tank and an immersion cooling device.

BACKGROUND

As one of techniques for cooling an electronic device such as a server that generates heat when the electronic device is operated, a technique that uses an immersion cooling device is known. With this immersion cooling device, the electronic device is cooled by being immersed in a coolant such as a fluorinated inert liquid stored in a tank. For example, for such an immersion cooling device, there is a known technique that suppresses variation of an internal pressure of a vapor phase region with a bag-shaped container or the like. This container communicates with the vapor phase region of the immersion tank that stores the coolant, and the volume or the inner capacity of the container varies in accordance with the internal pressure of the vapor phase region.

For example, Japanese Laid-open Patent Publication No. 2018-010980 has been disclosed as the related art.

SUMMARY

According to an aspect of the embodiments, an immersion tank includes a tank main body configured to store a coolant, at least one first air bag that is provided in the tank main body, that is coupled to a bottom portion of the tank main body, that is able to be inflated toward an upper portion of the tank main body, and that is able to be deflated, from an inflated state thereof, toward the bottom portion, and a guide member that is provided outside the at least one first air bag in the tank main body and that is configured to guide the at least one first air bag during the inflation and the deflation of the at least one first air bag.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In an immersion cooling device, when an electronic device is installed in an immersion tank that stores a fixed amount of a coolant or an electronic device installed in the immersion tank is removed to the outside of the immersion tank, the liquid height of the coolant stored in the tank is displaced depending on the type and the number of the electronic devices. The displacement of the liquid height of the coolant stored in the immersion tank may cause the coolant to spill to the outside of the immersion tank when an electronic device is installed in the immersion tank, a remaining electronic device in the coolant to be exposed from the coolant after a different electronic device has been removed to the outside of the immersion tank, or a cooling failure or the like to occur due to the exposure of the electronic device.

In one aspect, an object of the present embodiments is to suppress displacement of a liquid height of a coolant stored in an immersion tank.

First Embodiment

Figure 1:
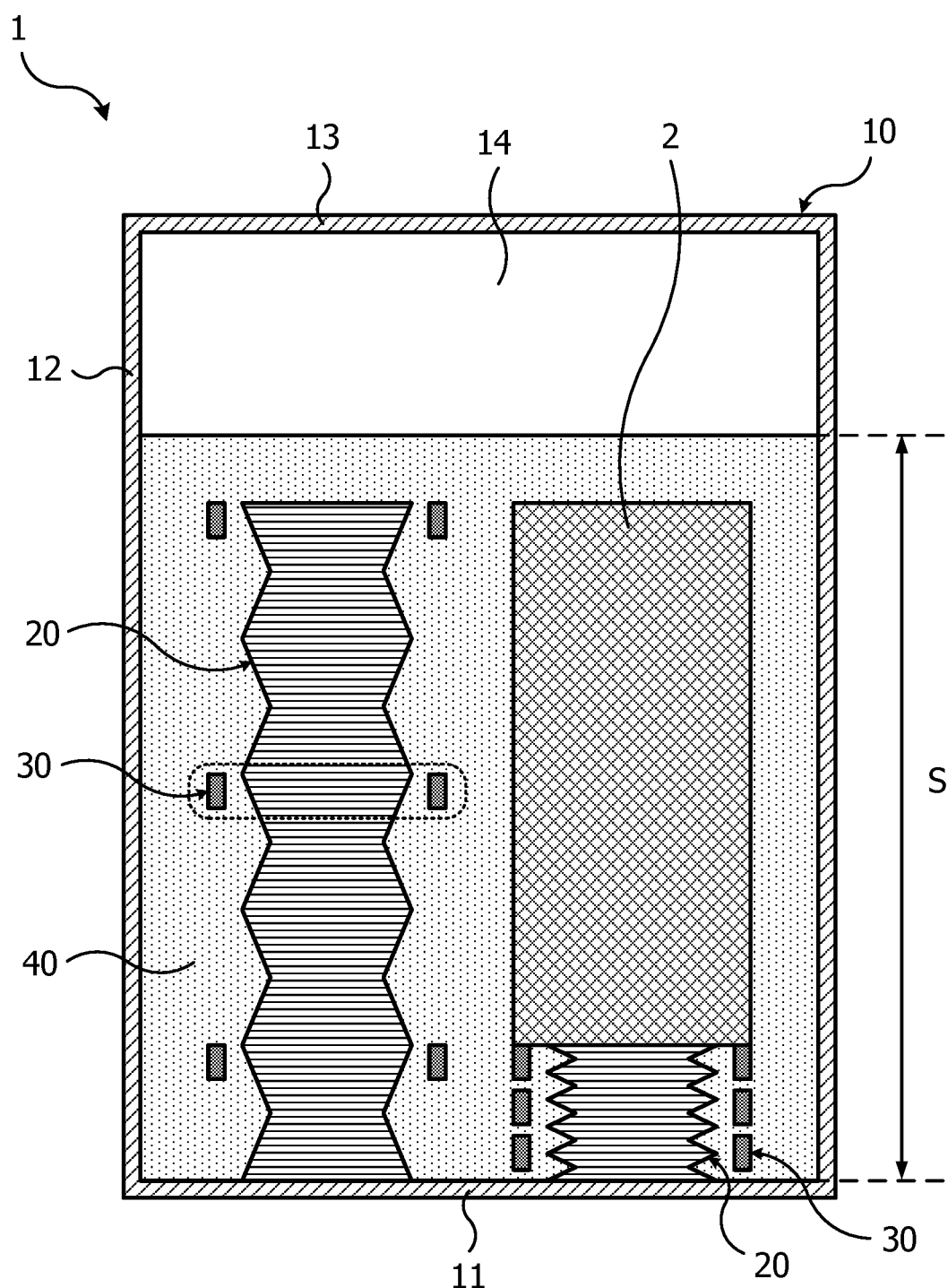
FIG. 1 illustrates an example of an immersion tank according to a first embodiment.

FIG. 1 illustrates an example of an immersion tank according to a first embodiment. In FIG. 1, the section of a main part of the example of the immersion tank is schematically illustrated.

An immersion tank 1 illustrated in FIG. 1 includes a tank main body 10, air bags 20, and guide units 30.

The tank main body 10 includes a bottom portion 11, side wall portions 12 rising upward from the bottom portion 11, and a lid portion 13 covering the bottom portion 11 and the side wall portions 12. The tank main body 10 is formed of, for example, a metal material, a resin material, a carbon material, or a composite material of resin and a fiber or cloth of a glass material or a carbon material.

The tank main body 10 stores a coolant 40. The coolant 40 has a thermally conducting property and an insulating property. For example, a fluorinated inert liquid is used as the coolant 40. An electronic device 2 such as a server or a storage that generates heat when the electronic device 2 is operated is immersed in the coolant 40 stored in the tank main body 10. The heat generated in the electronic device 2 is transmitted to the coolant 40, thereby the electronic device 2 is cooled. A vapor phase region 14 is provided between the coolant 40 and the lid portion 13 in the tank main body 10. The vapor phase region 14 is able to contain gas such as air or vapor that evaporates from the coolant 40 due to the heat from the electronic device 2.

The tank main body 10 may include a discharge line through which the gas in the vapor phase region 14 is discharged to the outside. A valve used for adjustment of an internal pressure of the vapor phase region 14 may be provided in the discharge line.

Each of the air bags 20 is provided in the tank main body 10. The air bag 20 is an example of a bag body. For example, a bellows-type bag body which is stretchable in the up-down direction, a bag body formed of a stretchable material (such as an elastic body), or the like is used as the air bag 20. The air bag 20 is formed of, for example, a resin material, an elastic material, or the like. For example, the air bag 20 may be formed of a material for suppressing permeation of the coolant 40 stored in the tank main body 10 or a material to which surface treatment for suppressing the permeation of the coolant 40 is applied. The air bag 20 is provided at a location where the electronic device 2 to be immersed in the coolant 40 is installed in the tank main body 10. The electronic device 2 is to be installed is installed (placed) over the air bag 20. The volume of the air bag 20 is set, for example, in accordance with the size or the volume of the electronic device 2 to be installed over the air bag 20.

The air bag 20 is secured by coupling one end thereof to the bottom portion 11 of the tank main body 10. As illustrated on the left side of the tank main body 10 in FIG. 1, the air bag 20 is inflated toward an upper portion (toward the lid portion 13 or the vapor phase region 14) of the tank main body 10 with the one end thereof coupled to the bottom portion 11 of the tank main body 10. For example, the air bag 20 is inflated when the air bag 20 is urged upward by an urging unit of an elastic body such as a spring provided in the air bag 20 or air is supplied into the air bag 20. As illustrated on the right side of the tank main body 10 in FIG. 1, from the inflated state, the air bag 20 is deflated toward the bottom portion 11 of the tank main body 10. For example, when the electronic device 2 is installed over the air bag 20, the air bag 20 in the inflated state is deflated because the air bag 20 is pushed downward against the urging force of the elastic body provided in the air bag 20 by the weight of the electronic device 2 or because the air inside the air bag 20 is discharged by being pushed downward by the weight of the electronic device 2.

Although two air bags 20 are provided in the example illustrated in the sectional view of FIG. 1, a single air bag 20 or three or more air bags 20 may be provided in the tank main body 10. Although a single air bag 20 is provided at a location where a single electronic device 2 is installed in the example illustrated in the sectional view of FIG. 1, a plurality of air bags 20 may be provided at this location. Also, a support unit for suppressing collapsing of the air bag 20 due to the pressure of the coolant 40 may be provided in the air bag 20.

The guide units 30 are each provided outside the air bag 20 in the tank main body 10. The guide unit 30 may be formed of any of various materials and may have any of various shapes as long as the air bag 20 during inflation and deflation is able to be guided. For example, the guide unit 30 is a frame-shaped member surrounding the air bag 20. For example, a plurality of (for example, three) different guide units 30 (the guide unit 30 surrounded by a dotted line box in FIG. 1 represents a single guide unit 30) are provided at different levels from the bottom portion 11 in the tank main body 10. As is the case with the air bag 20, the guide unit 30 is provided at a location where the electronic device 2 immersed in the coolant 40 is installed in the tank main body 10. The electronic device 2 to be installed is installed (placed) over the air bag 20 and the guide unit 30 (the uppermost guide unit 30 when the plurality of guide units 30 are provided).

As illustrated on the left side of the tank main body 10 in FIG. 1, the guide unit 30 (each of the guide units 30 when the plurality of guide units 30 are provided) ascends toward the lid portion 13 in the tank main body 10 as the air bag 20 is inflated, and, as illustrated on the right side of the tank main body 10 in FIG. 1, descends toward the bottom portion 11 of the tank main body 10 as the air bag 20 is deflated. The guide unit 30 has a structure independently of the air bag 20. For example, the guide unit 30 ascends when the guide unit 30 is urged upward by an urging unit of an elastic body such as a spring. The guide unit 30 in a state in which the guide unit 30 has been ascended descends when the electronic device 2 is installed over the guide unit 30 and the guide unit 30 is pushed downward by the weight of the electronic device 2 against the urging force of the elastic member. The guide unit 30 ascends and descends as the air bag 20 is inflated and deflated, thereby guiding the air bag 20 during the inflation and deflation. Ascending and descending of the guide unit 30 may suppress bending or falling of the air bag 20 during deflation.

The tank main body 10 of the immersion tank 1 stores the coolant 40 in such an amount that the installed electronic device 2 that is an object of cooling is entirely immersed. For example, the coolant 40 having a liquid height S as illustrated in FIG. 1 is stored. In the immersion tank 1, even when the electronic device 2 having been installed is removed from the coolant 40 due to, for example, a specification change or maintenance, or a different electronic device is installed (added) in the coolant 40, displacement of the liquid height S of the coolant 40 stored in the tank main body 10 is suppressed.

Figure 2A:
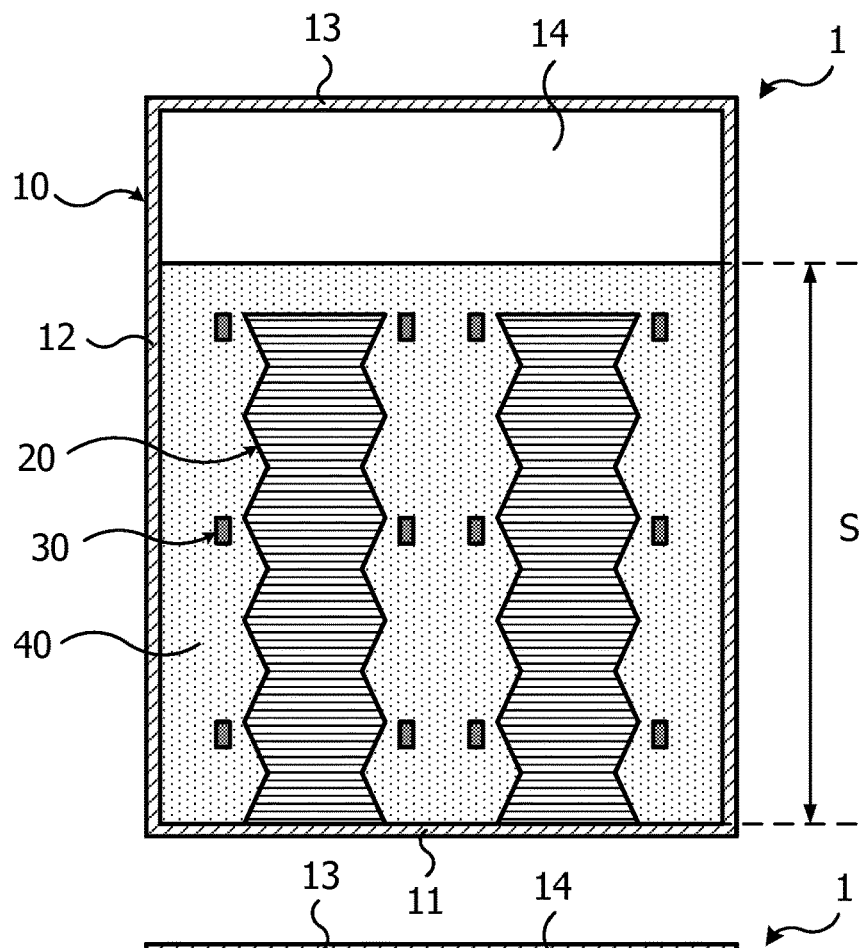
FIGS. 2A and 2B illustrate a liquid height of a coolant in the immersion tank according to the first embodiment.
Figure 2B:
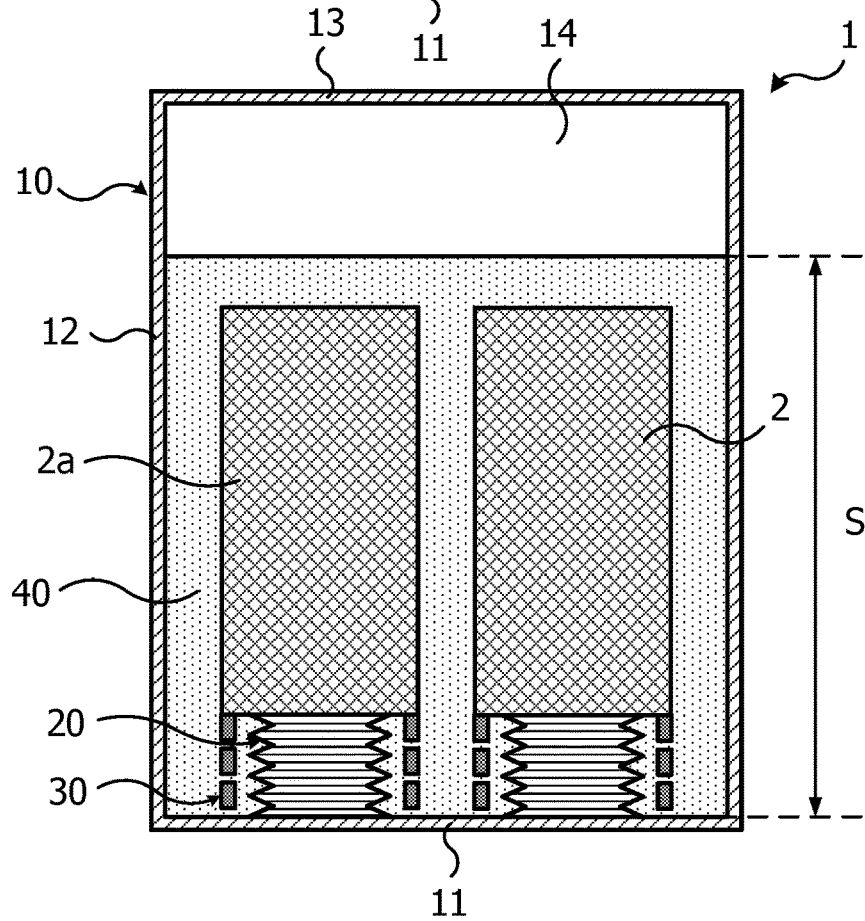

FIGS. 2A and 2B illustrate the liquid height of the coolant in the immersion tank according to the first embodiment. FIGS. 2A and 2B schematically illustrate the section of a main part of the example of immersion tank.

FIG. 2A illustrates an example in which the electronic device 2 over the air bag 20 as illustrated in FIG. 1 is removed from a position over the air bag 20. The air bag 20 (one or more air bags 20) having been pushed downward and deflated by the weight of the electronic device 2 is inflated by the urging force of the elastic body provided therein or supply of air thereinto when the pressure applied by the weight is removed as a result of the removal of the electronic device 2. The guide unit 30 having been pushed downward by the weight of the electronic device 2 ascends, as the air bag 20 is inflated, by the urging force of the elastic body when the pressure applied by the weight of the electronic device 2 is removed as a result of the removal of the electronic device 2. The air bag 20 is inflated while being guided by the ascending guide unit 30. In the immersion tank 1, the volume of the electronic device 2 immersed in the coolant 40 is replaced with the volume of the air bag 20 that is inflated when the electronic device 2 is removed (volume increased by the inflation). This suppresses lowering of a liquid level of the coolant 40 caused by the removal of the electronic device 2. This also suppresses displacement from the liquid height S before the removal of the electronic device 2.

FIG. 2B illustrates an example in which an electronic device 2a is added over the inflated air bag 20 as illustrated in FIG. 1. When the electronic device 2a is added over the inflated air bag 20, the inflated air bag 20 (one or more air bags 20) is pressed downward by the weight of the electronic device 2a and is deflated by pressure or discharge of air from the inside of the air bag 20 against the urging force of the elastic body provided in the air bag 20. When the electronic device 2a is added, the guide unit 30 surrounding the air bag 20 is pushed downward by the weight of the electronic device 2a and descends by pressure against the urging force of the elastic body. The air bag 20 is deflated while being guided by the descending guide unit 30. In the immersion tank 1, the volume of the air bag 20 deflated when the electronic device 2a is added (volume reduced by the deflation) is replaced with the volume of the added electronic device 2a. This suppresses rising of the liquid level of the coolant 40 caused by the addition of the electronic device 2a. This also suppresses displacement from the liquid height S before the addition of the electronic device 2a.

As described above, in the immersion tank 1, the volume occupied by the air bag 20 in the coolant 40 when the air bag 20 is inflated and the volume of the removed electronic device 2 or the added electronic device 2a occupied in the coolant 40 are replaced with each other. This may effectively suppress the displacement of the liquid height S of the coolant 40 stored in the tank main body 10 of the immersion tank 1.

For comparison, an immersion tank without the air bag 20 as described above is described with reference to FIGS. 3A, 3B, and 4.

Figure 3A:
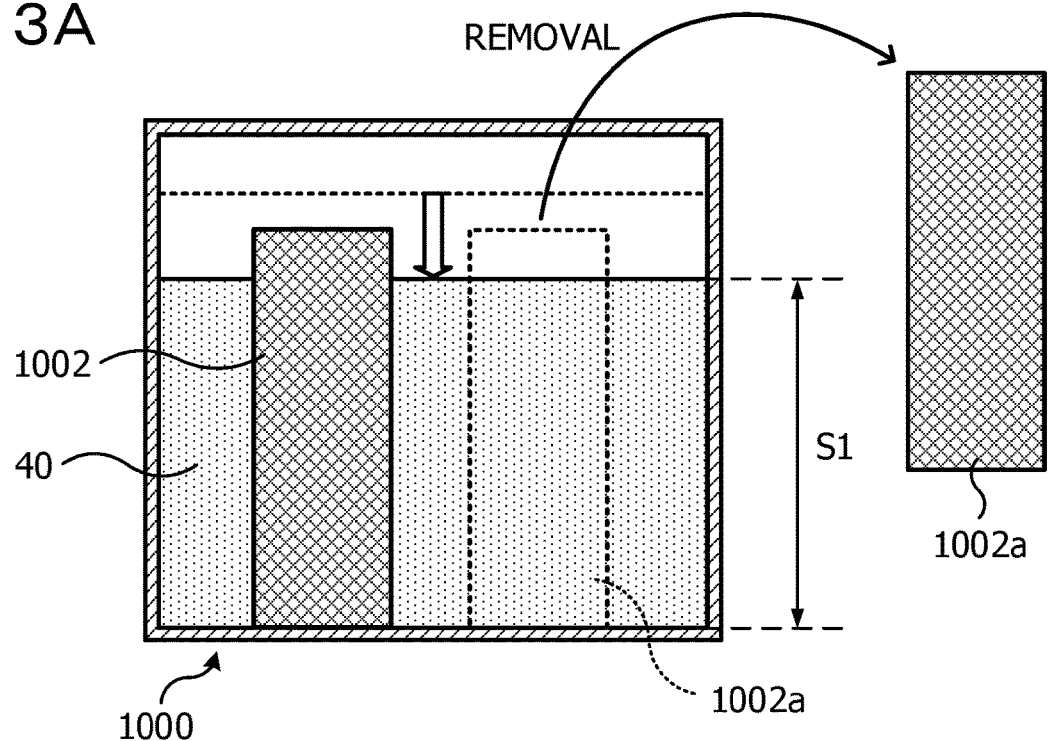
FIGS. 3A and 3B illustrate a different example of the immersion tank.
Figure 3B:
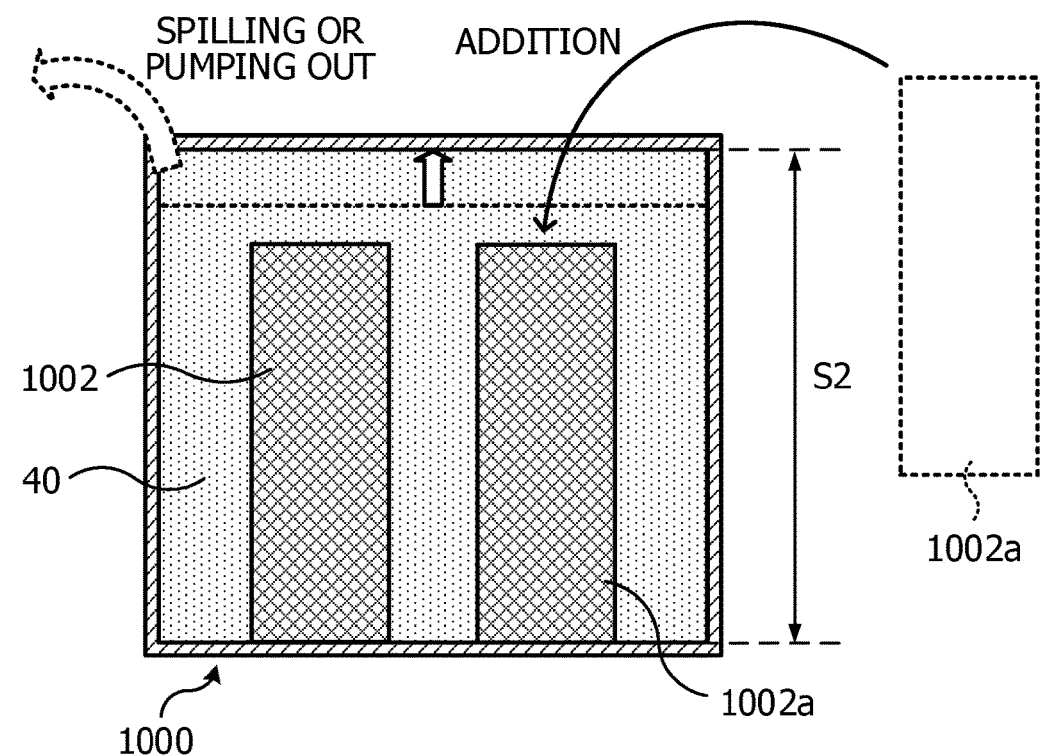

FIGS. 3A and 3B illustrate a different example of the immersion tank. FIGS. 3A and 3B schematically illustrate the section of a main part of an example of the immersion tank.

FIG. 3A illustrates an example in which one electronic device 1002a is removed from an immersion tank 1000 in which a fixed amount of the coolant 40 is stored and electronic devices 1002, 1002a have been immersed in the coolant 40. In FIG. 3A, the liquid level of the coolant 40 before the removal of the electronic device 1002a is indicated by a dotted line. In the immersion tank 1000, as indicated by a hollow arrow of a solid bold line in FIG. 3A, the liquid level of the coolant 40 is lowered by the volume of the removed electronic device 1002a. When the liquid level of the coolant 40 is lowered and the height of the liquid becomes a liquid height S1 as illustrated in FIG. 3A, the electronic device 1002 that remains in the immersion tank 1000 after the removal of the electronic device 1002a is exposed from the coolant 40. This may lead to insufficient cooling of the electronic device 1002. The insufficient cooling of the electronic device 1002 may cause overheat, and the overheat of the electronic device 1002 may reduce the performance of electronic device 1002 or cause damage to the electronic device 1002.

FIG. 3B illustrates an example in which the electronic device 1002a is added to the immersion tank 1000 in which a fixed amount of the coolant 40 is stored and the electronic device 1002 is immersed in the coolant 40. In FIG. 3B, the liquid level of the coolant 40 before the addition of the electronic device 1002a is indicated by a dotted line. In the immersion tank 1000, as indicated by a hollow arrow of a solid bold line in FIG. 3B, the liquid level of the coolant 40 rises by the volume of the added electronic device 1002a. When the liquid level of the coolant 40 rises and exceeds the liquid height S2 (maximum value) of the coolant 40 able to be stored in the immersion tank 1000 as illustrated in FIG. 36, the coolant 40 may spill to the outside of the immersion tank 1000, or pumping out the coolant 40 by using a pump or the like may be required for suppressing the overflow or the like.

As described above, in the immersion tank 1000, when the electronic device 1002a is removed or added, the liquid height of the coolant 40 is displaced. As a result, insufficient cooling of the electronic device 1002 remaining in the coolant 40, spilling of the coolant 40 to the outside, or the like may occur.

For this reason, in the immersion tank 1000, when the electronic device 1002a is removed or added, the coolant 40 is discharged or additionally supplied to adjust the liquid height of the coolant 40 such that the liquid height is the same as or equal to the liquid height before the removal or addition. For example, the adjustment of the liquid height by discharging or additionally supplying the coolant 40 is performed with a system as illustrated in FIG. 4 described below.

Figure 4:
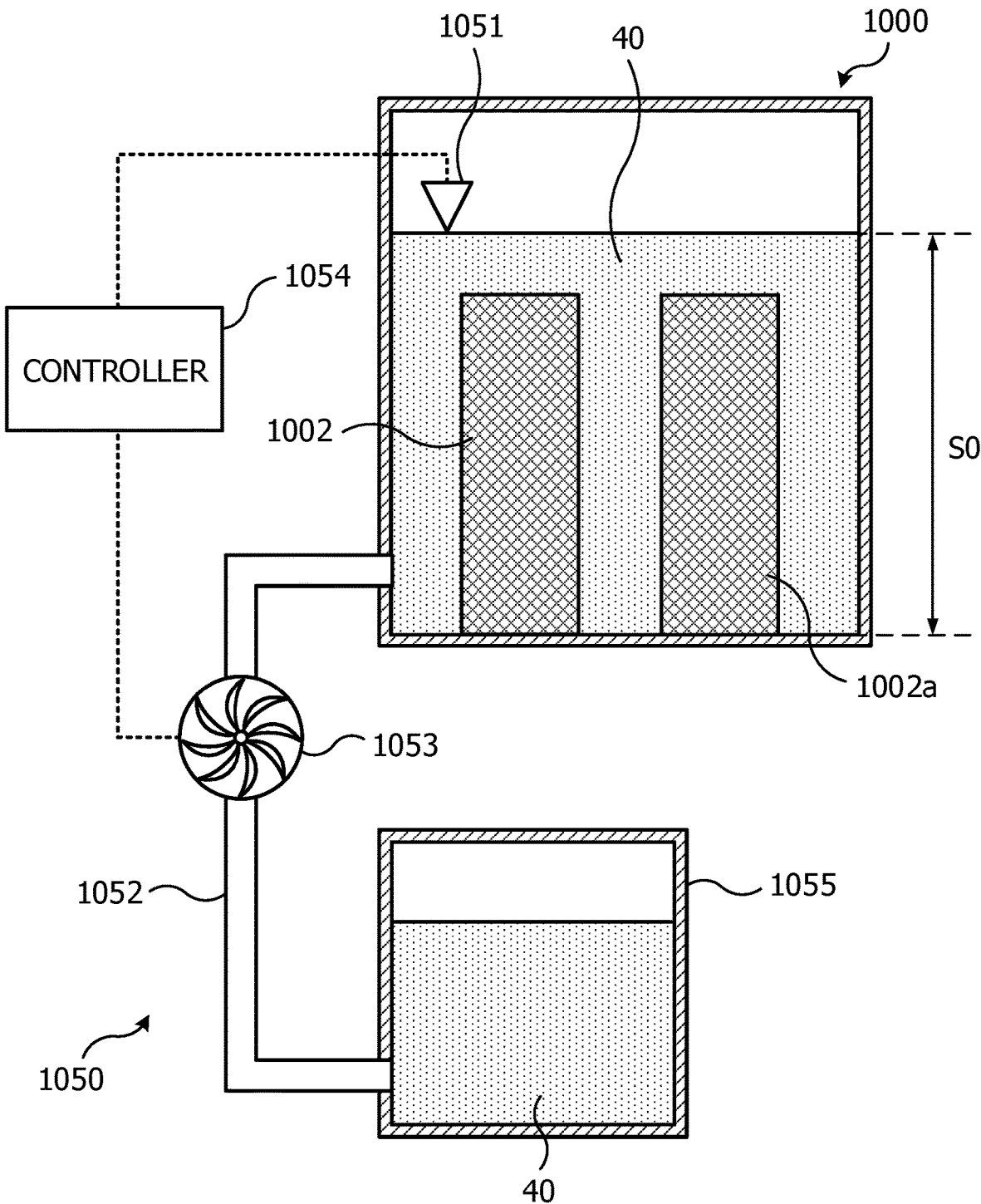
FIG. 4 illustrates an immersion tank for which a system for adjusting a liquid height of the coolant is employed.

FIG. 4 illustrates an immersion tank for which a system for adjusting a liquid height of the coolant is employed.

For example, a system 1050 as illustrated in FIG. 4 is employed for the immersion tank 1000 as described above (FIG. 3A and FIG. 3B). The system 1050 includes a sensor 1051 that monitors the liquid height of the coolant 40 stored in the immersion tank 1000. The immersion tank 1000 further includes piping 1052 and a pump 1053 used to discharge or additionally supply the coolant 40, a controller 1054 that controls the pump 1053 in accordance with information detected by the sensor 1051, and a reserve tank 1055 that stores the coolant 40 to be additionally supplied or discharged.

For example, when the electronic device 1002a is removed, lowering of the liquid level of the coolant 40 due to the removal of the electronic device 1002a is detected by the sensor 1051, drive of the pump 1053 is controlled by the controller 1054 in accordance with the information of the sensor 1051, and the coolant 40 is additionally supplied from the reserve tank 1055 to the immersion tank 1000 through the piping 1052. When the electronic device 1002a is added, rising of the liquid level of the coolant 40 due to the addition of the electronic device 1002a is detected by the sensor 1051, drive of the pump 1053 is controlled by the controller 1054 in accordance with the information of the sensor 1051, and the coolant 40 is discharged from the immersion tank 1000 to the reserve tank 1055 through the piping 1052. In the immersion tank 1000, with the system 1050 as described above, the coolant 40 is discharged or additionally supplied by the system 1050 when the electronic device 1002a is added or removed, thereby the coolant 40 stored in the immersion tank 1000 is adjusted such that a fixed liquid height S0 is maintained before and after the removal or addition of the electronic device 1002a.

However, when such a system 1050 is employed, for example, cost may be required for incorporation of the system 1050 into the immersion tank 1000 and operation of the system 1050, and the installation space may be allocated to the system 1050.

In order to suppress displacement of the liquid height of the coolant 40 and to suppress insufficient cooling of the electronic device 1002 remaining in the coolant 40, spilling of the coolant 40 to the outside, or the like without using the system 1050 when the electronic device 1002a is removed or added, the following method may be used. For example, the size of the immersion tank 1000 is increased to such a degree that the immersion tank 1000 stores the coolant 40 in an amount with which the electronic device 1002 remaining in the coolant 40 is not exposed even in the case where the electronic device 1002a is removed and the immersion tank 1000 reliably provides a space over the coolant 40 to suppress spilling of the coolant 40 even in the case where the electronic device 1002a is added.

However, with this method, since the immersion tank 1000 is increased in size, it is required to allocate a larger space. The coolant 40 has a thermally conducting property and an insulating property as described above. The specific gravity of such a coolant 40 has a larger than water, and the cost of such a coolant 40 is high. Thus, when the immersion tank 1000 is increased in size and the coolant 40 stored in the immersion tank 1000 is increased, the weight of the immersion tank 1000 storing the coolant 40 in which the electronic device 1002 or the like is immersed is increased. Consequently, the withstand load of the floor of the location where the immersion tank 1000 is disposed is exceeded or the location where the immersion tank 1000 is disposed is limited. Also, when the immersion tank 1000 is increased in size and the coolant 40 stored in the immersion tank 1000 is increased in amount, the cost required for the coolant 40 to be used is increased. From the viewpoints of the weight and cost as described above, it is preferable that the amount of the coolant 40 stored in the immersion tank 1000 be as small as possible. However, with a small amount of the coolant 40, the situations as illustrated in FIGS. 3A and 3B described above may occur, or use of the system 1050 as illustrated in FIG. 4 described above may be required.

The immersion tank 1 (FIGS. 1, 2A, and 2B) according to the first embodiment includes the air bag 20 as described above. The air bag 20 is inflated in the case where the electronic device 2, 2a is not installed (or before the installation of the air bag 20) and deflated in the case where the electronic device 2, 2a is installed. For example, in the immersion tank 1, when the electronic device 2 is removed, the volume of the removed electronic device 2 is replaced with the volume of the air bag 2 inflated due to the removal of the electronic device 20 (volume increased by the inflation). This may effectively suppress the displacement of the liquid height S (lowering of the liquid level) of the coolant 40 when the electronic device 2 is removed. In contrast, in the immersion tank 1, when the electronic device 2a is added, the volume of the air bag 20 deflated due to the addition of the electronic device 2a (volume reduced by the deflation) is replaced with the volume of the added electronic device 2a. This may effectively suppress the displacement of the liquid height S (rising of the liquid level) of the coolant 40 when the electronic device 2a is added.

The immersion tank 1 includes the air bag 20 that is inflated and deflated as described above. The displacement of the liquid height S of the coolant 40 is suppressed by the inflation and deflation of the air bag 20. Accordingly, it is not required to additionally supply the coolant 40 to the immersion tank 1 in the case where the electronic device 2 is removed or discharge the coolant 40 from the immersion tank 1 in the case where the electronic device 2a is added. The amount of the coolant 40 to be stored in the immersion tank 1 is set to a comparatively small amount such that, for example, when a maximum number of electronic device groups are installed in the immersion tank 1, all of these electronic device groups are able to be immersed in the coolant 40 (for example, a minimum amount of the coolant 40). With the immersion tank 1, it is not required that the above-described system 1050 be employed for additionally supplying and discharging the coolant 40. Thus, problems such as the cost that would be incurred for employing the system 1050 or a space that would be allocated for installation of the system 1050 may be avoided. With the immersion tank 1, it is not required to increase the size of the tank main body 10 of the immersion tank 1 as described above or increase the amount of the coolant 40 to be used. Thus, the problems such as allocation of the installation space, the increase in weight and withstand load of the floor, and the increase in cost of the coolant 40 may be avoided.

With the immersion tank 1 that utilizes inflation and deflation of the air bag 20 to suppress the displacement of the liquid height S of the coolant 40 stored therein, reduction in size, weight, and cost may be realized.

Second Embodiment

An example of an immersion tank for which the structure as described according to the first embodiment is employed is described below as a second embodiment.

Figure 5:
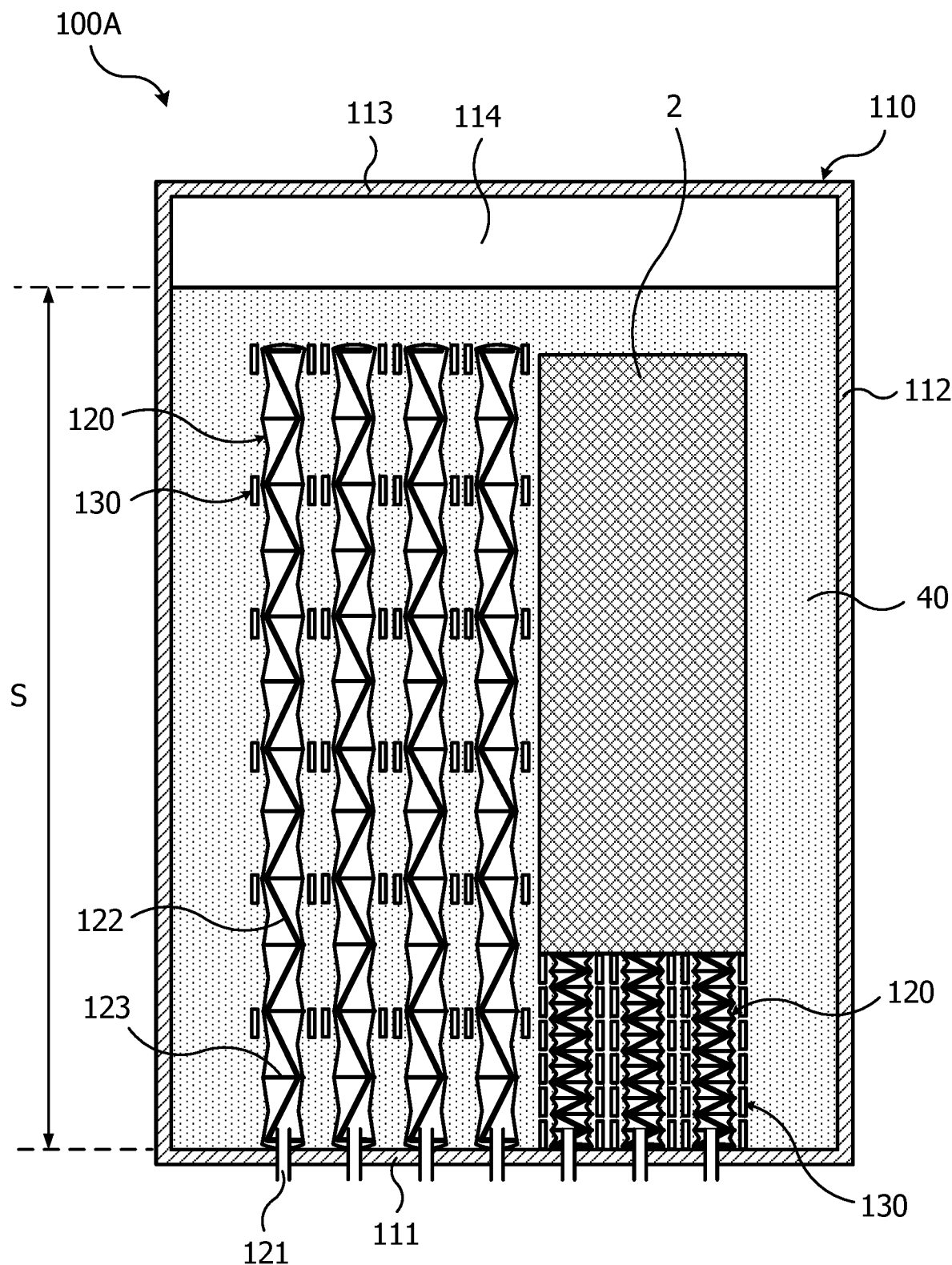
FIG. 5 illustrates an example of an immersion tank according to a second embodiment (No. 1)
Figure 6:
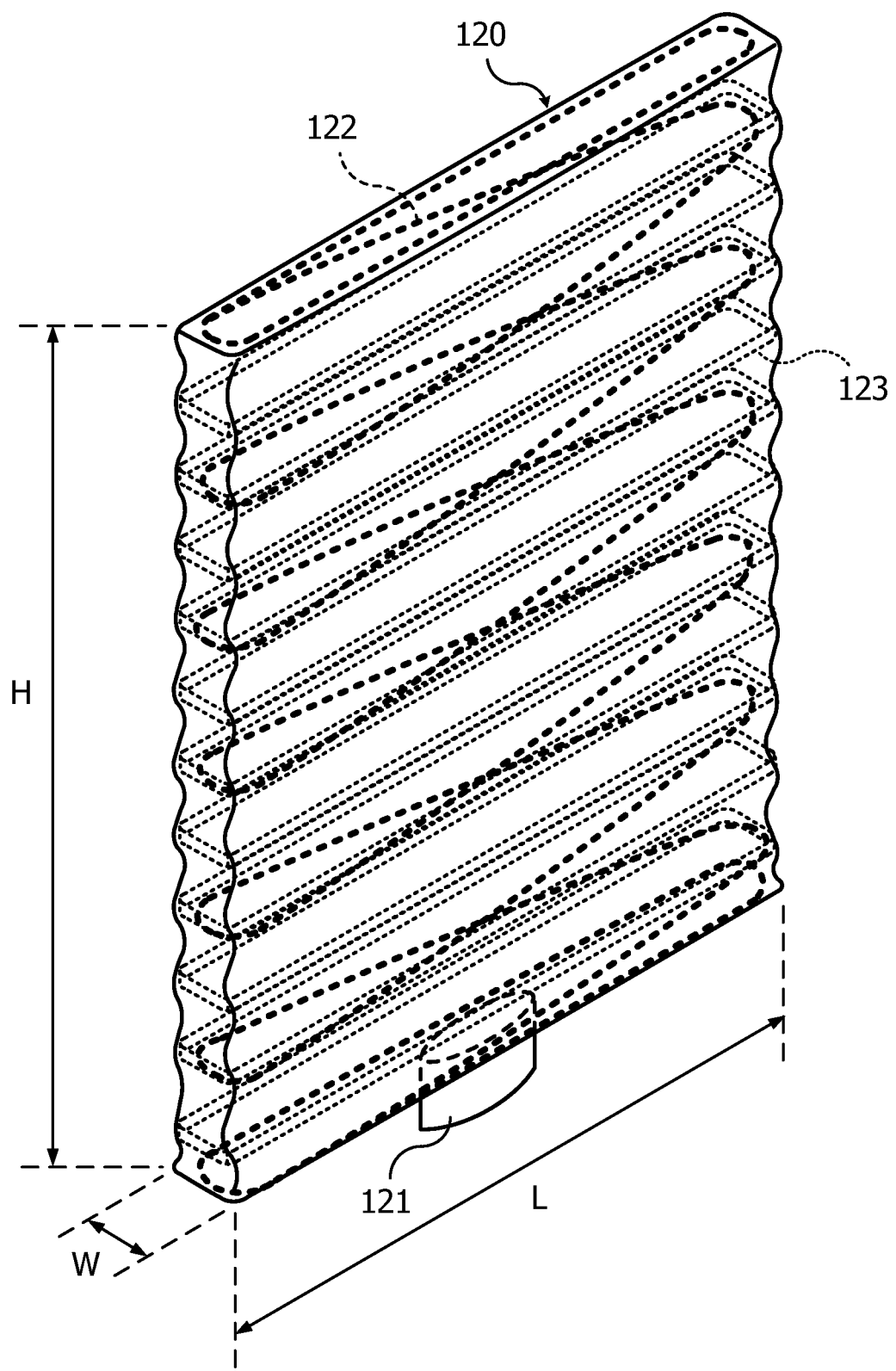
FIG. 6 illustrates the example of the immersion tank according to the second embodiment (No. 2)
Figure 7:
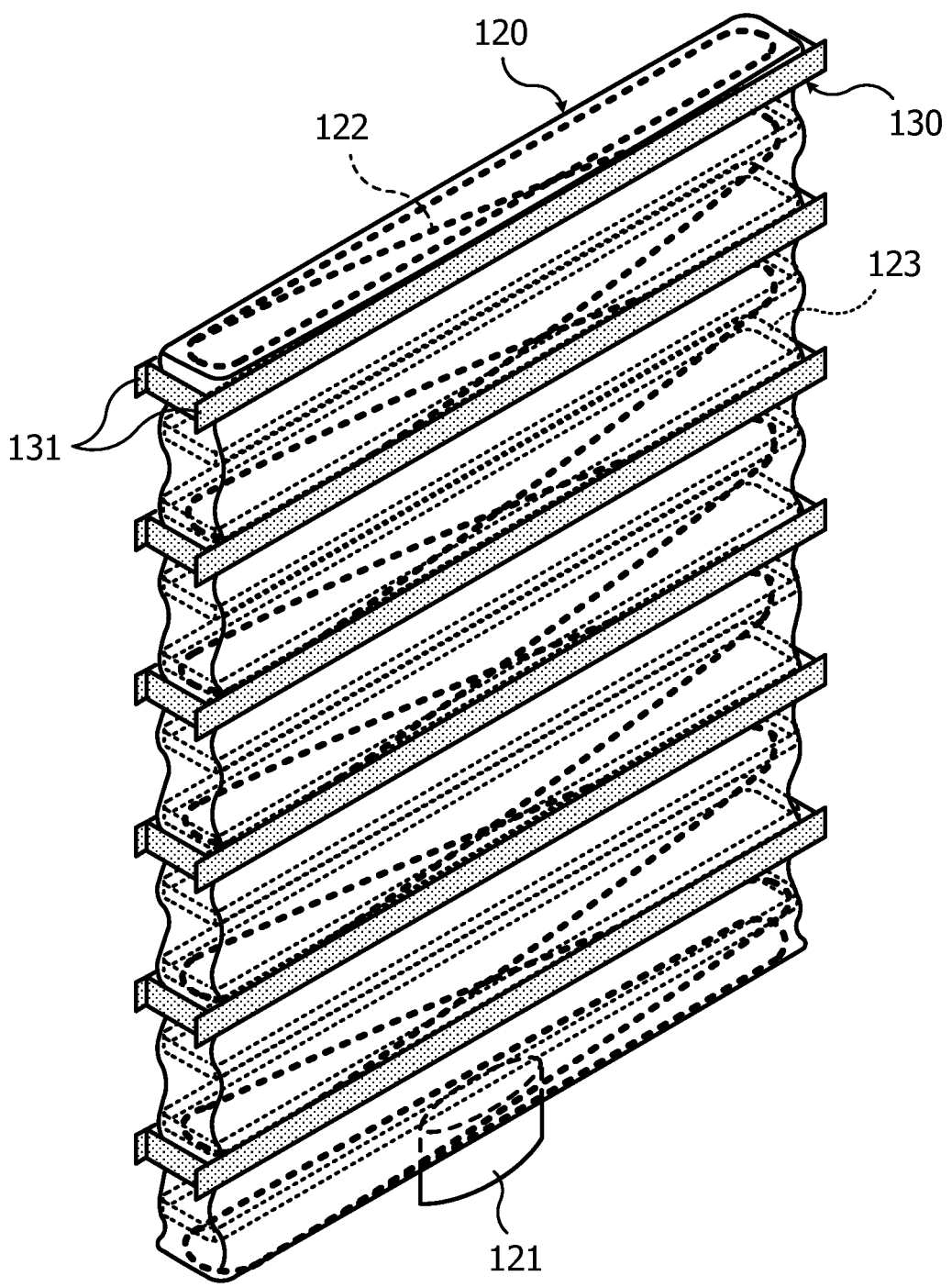
FIG. 7 illustrates the example of the immersion tank according to the second embodiment (No. 3)

FIGS. 5 to 8B illustrate the example of the immersion tank according to the second embodiment. FIG. 5 schematically illustrates the section of a main part of the example of the immersion tank. FIG. 6 is a schematic perspective view of a main part of an example of air bags. FIG. 7 is a schematic perspective view of a main part of examples of the air bags and guide units. FIGS. 8A and 86 are schematic exploded perspective views of main parts of the example of the immersion tank.

An immersion tank 100A illustrated in FIG. 5 includes a tank main body 110, air bags 120, and guide units 130.

As illustrated in FIG. 5, the tank main body 110 includes a bottom portion 111, side wall portions 112 rising upward from the bottom portion 111, and a lid portion 113 covering the bottom portion 111 and the side wall portions 112. The tank main body 110 is formed of, for example, a metal material, a resin material, a carbon material, or a composite material of resin and a fiber or cloth of a glass material or a carbon material.

The coolant 40 such as a fluorine inert liquid having a thermally conducting property and an insulating property is stored in the tank main body 110. The electronic device 2 such as a server or a storage that generates heat when the electronic device 2 is operated is immersed in the coolant 40 stored in the tank main body 110. The heat generated in the electronic device 2 is transmitted to the coolant 40, thereby the electronic device 2 is cooled. A vapor phase region 114 is provided between the coolant 40 in the tank main body 110 and the lid portion 113. The vapor phase region 114 is able to contain gas such as air or vapor of the coolant 40 evaporated due to the heat from the electronic device 2.

The tank main body 110 may be provided with a discharge line through which the gas in the vapor phase region 114 is discharged to the outside. A valve used for adjustment of the internal pressure of the vapor phase region 114 may be provided in the discharge line.

As illustrated in FIG. 5, the air bags 120 are provided in the tank main body 110. Each of the air bags 120 is an example of the bag body. For example, a bellows-type bag body which is stretchable in the up-down direction, a bag body formed of a stretchable material (such as an elastic body), or the like is used as the air bag 120. The air bag 120 is formed of, for example, a resin material, an elastic material, or the like. For example, the air bag 120 may be formed of a material for suppressing permeation of the coolant 40 stored in the tank main body 110 or a material to which surface treatment for suppressing the permeation of the coolant 40 is applied. In this example, a plurality of (for example, in sectional view, seven) air bags 120 are provided in the tank main body 110. The air bags 120 are provided at a location where the electronic device 2 immersed in the coolant 40 in the tank main body 110 is installed. The electronic device 2 is installed (placed) over the air bags 120. Although the plurality of (for example, three) air bags 120 are provided at the location where a single electronic device 2 is installed in the example illustrated in the sectional view of FIG. 5, this does not limit the number of the air bags 120 provided at this location.

As illustrated in FIG. 5, each of the air bags 120 is secured by coupling one end thereof to the bottom portion 111 of the tank main body 110. As illustrated in FIGS. 5 and 6, an air vent 121 penetrating through the bottom portion 111 and communicating with the outside of the tank main body 110 is provided at the one end of the air bag 120 coupled to the bottom portion 111. Air is supplied from the outside of the tank main body 110 to the inside of the air bag 120 through the air vent 121 and discharged from the inside of the air bag 120 to the outside of the tank main body 110 through the air vent 121. The air bag 120 is inflated toward the upper portion (toward the lid portion 113 or the vapor phase region 114) of the tank main body 110 with the one end coupled to the bottom portion 111 (four air bags 120 on the left side of the tank main body 110 illustrated in FIG. 5) and, from the inflated state, deflated toward the bottom portion 111 (three air bags 120 on the right side of the tank main body 110 illustrated in FIG. 5).

FIG. 6 illustrates an example of the air bag 120 in the inflated state. For example, the air bag 120 of the immersion tank 100A has a substantially rectangular parallelepiped shape or a generally rectangular parallelepiped shape when the air bag 120 is in the inflated state. The dimensions (a width W, a length L, and a height H) of the air bag 120 and the volume of the air bag 120 when the air bag 120 is inflated may be set in accordance with the size and volume of the electronic device 2 installed over the air bag 120. For example, when a rack is used for the electronic device 2, the width W and length L of the air bag 120 are set to be a standard (a standard unit height 1 U (44.45 mm) of a 19-inch rack or the like) of a unit chassis of the rack or a multiple of the standard. This facilitates setting of the number of the air bags 120 to be used for the installation of a single electronic device 2, setting of the total number of the air bags 120 provided in the tank main body 110, and so forth. The air bag 120 illustrated in FIG. 5 corresponds to the air bag 120 illustrated in FIG. 6 when seen from the surface side of the width W of the air bag 120 (the depth direction of the page of FIG. 5 is the length direction in FIG. 6).

As illustrated in FIGS. 5 and 6, a spring 122 serving as the urging unit that urges the air bag 120 upward is provided in the air bag 120. The spring 122 is provided inside the air bag 120 and has a function of inflating the air bag 120 by the urging force that urges the air bag 120 upward. The spring 122 may be formed of any of various materials and may have any of various shapes. For example, as illustrated in FIG. 6, the spring 122 is a coil-shaped spring wound along an inner surface of the air bag 120. A flat spring may be used as the spring 122.

As illustrated in FIGS. 5 and 6, support units 123 are provided in the air bag 120. Each of the support units 123 is provided inside the air bag 120 and has a function of suppressing inward collapsing of the air bag 120 caused by the pressure of the coolant 40 stored in the tank main body 110. The support unit 123 may be formed of any of various materials and may have any of various shapes. The support unit 123 has such a size that the support unit 123 does not influence the inflation or deflation of the air bag 120, and the support unit 123 has such a shape that the support unit 123 is able to suppress inward collapsing of the air bag 120. For example, a plurality of (for example, eleven) frame-shaped support units 123 are mounted to the inner surface of the air bag 120 so as to be equally spaced from one another in the height direction (or the up-down direction or the inflation/deflation direction).

In the immersion tank 100A illustrated in FIG. 5, each of the air bags 120 over which the electronic device 2 is not installed (or before the electronic device 2 is installed) is inflated when the air bag 120 is urged upward by the urging force of the spring 122 provided in the air bag 120, and the external air is taken into the air bag 120 through the air vent 121. The air bag 120 over which the electronic device 2 is not installed is extended by the inner spring 122 from the bottom portion 111 of the tank main body 110 toward the lid portion 113 to the maximum height of the air bag 120 and extended outward by the inner support units 123, thereby the air bag 120 is inflated to the maximum volume of the air bag 120. When the electronic device 2 is installed over the inflated air bag 120, the air bag 120 is pushed downward by the weight of the electronic device 2 against the urging force of the spring 122 in the air bag 120, and the air inside the air bag 120 is discharged through the air vent 121. Thus, the air bag 120 is deflated.

As illustrated in FIGS. 5 and 7, the guide units 130 are each provided outside the air bag 120 in the tank main body 110. The guide unit 130 may be formed of any of various materials and may have any of various shapes as long as the air bag 120 during inflation and deflation is able to be guided. For example, the guide unit 130 is a frame-shaped member surrounding the air bag 120. For example, a plurality of (for example, six) different guide units 130 are provided at different levels from the bottom portion 111 in the tank main body 110. As is the case with the air bag 120, the guide unit 130 is provided at the location where the electronic device 2 immersed in the coolant 40 is installed in the tank main body 110. The electronic device 2 to be installed is installed (placed) over the air bag 120 and the uppermost guide unit 130.

Figure 8A:
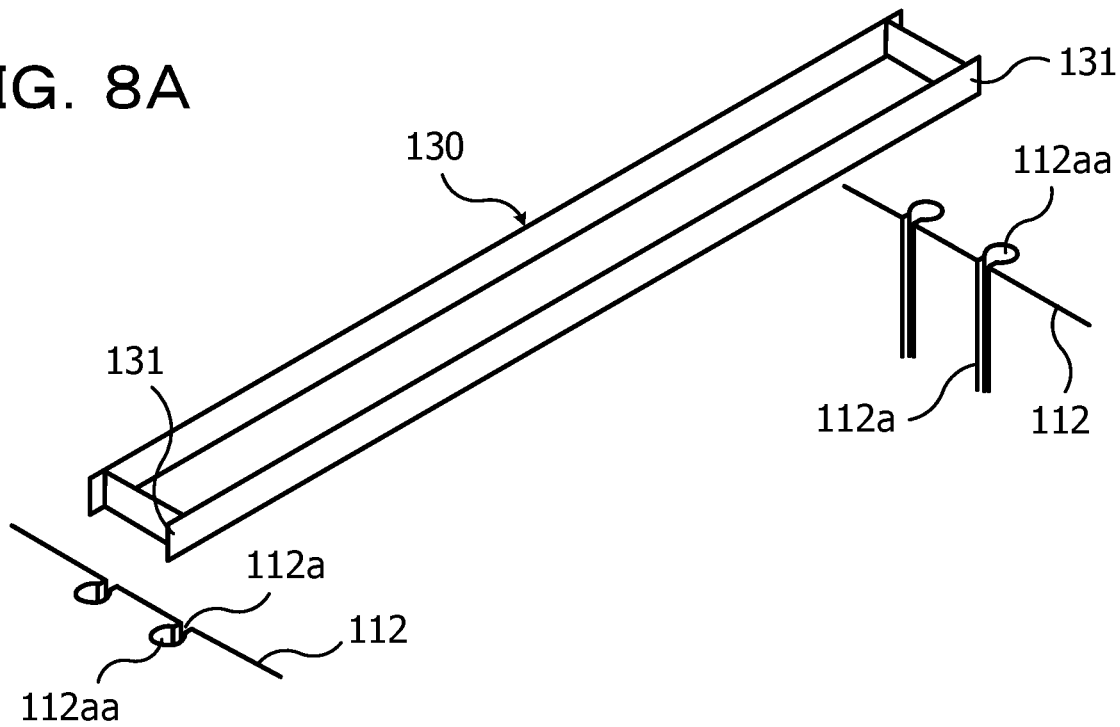
FIGS. 8A and 8B illustrate the example of the immersion tank according to the second embodiment (No. 4)
Figure 8B:
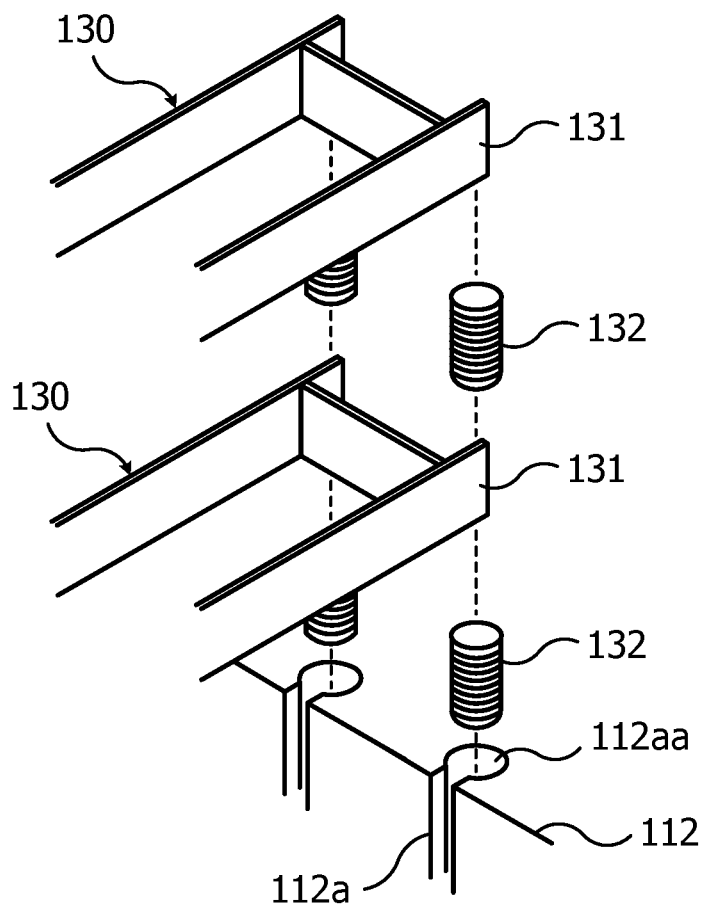

The guide unit 130 ascends along the side wall portions 112 of the tank main body 110 as the air bag 120 is inflated and descends along the side wall portions 112 as the air bag 120 is deflated. For example, as illustrated in FIGS. 8A and 8B, grooves 112a extending in the up-down direction are provided in the side wall portions 112 of the tank main body 110 facing each other (a pair of grooves 112a per side wall portion 112). The guide unit 130 has fitting portions 131 fitted into the grooves 112a of the side wall portions 112 such that the fitting portions 131 are upwardly and downwardly movable. The guide unit 130 ascends or descends along the side wall portions 112 in the tank main body 110 while the fitting portions 131 thereof fitted into the respective grooves 112a of the side wall portions 112 are guided through the grooves 112a.

Springs 132 are provided between the fitting portions 131 of the lowermost guide unit 130 fitted into the grooves 112a of the side wall portions 112 and the bottom portion 111 and between the fitting portions 131 of the guide units 130 fitted into the grooves 112a. The springs 132 that each serve as the urging unit urge the guide units 130 upward. For example, the springs 132 have a coil shape able to be inserted into (enlarged width portions 112aa of) the grooves 112a of the side wall portions 112 as illustrated in FIG. 8B. When such springs 132 are inserted into the grooves 112a between the bottom portion 111 and the fitting portions 131 of the lowermost guide unit 130 and the grooves 112a between the fitting portions 131 of the guide units 130, the guide units 130 are urged upward by the springs 132.

In the immersion tank 100A illustrated in FIG. 5, the air bag 120 over which the electronic device 2 is not installed is inflated when the air bag 120 is urged upward by the urging force of the spring 122 provided in the air bag 120, and the external air is taken into the air bag 120 through the air vent 121. As illustrated in FIGS. 8A and 8B, a plurality of guide units 130 surrounding this air bag 120 are urged upward by the urging forces of the springs 132 inserted into the grooves 112a of the side wall portions 112 into which the fitting portions 131 are fitted, and the guide units 130 ascend. As described above, the guide units 130 ascend as the air bag 120 is inflated. During the inflation, the guide units 130 have the functions of guiding the air bag 120 and suppressing bending or falling of the air bag 120.

When the electronic device 2 is installed over the inflated air bag 120, the air bag 120 is pushed downward by the weight of the electronic device 2 against the urging force of the spring 122 in the air bag 120, and the air inside the air bag 120 is discharged through the air vent 121. Thus, the air bag 120 is deflated. The electronic device 2 is also installed over the uppermost guide unit 130 of the plurality of guide units 130 that surround the air bag 120 and that have ascended. When the electronic device 2 is installed, the guide units 130 are pushed downward by the weight of the electronic device 2 against the urging forces of the springs 132 inserted into the grooves 112a of the side wall portions 112 into which the fitting portions 131 are fitted as illustrated in FIGS. 8A and 8B. Thus, the guide units 130 descend. As described above, the guide units 130 descend as the air bag 120 is deflated. During the deflation, the guide units 130 have the functions of guiding the air bag 120 and suppressing bending or falling of the air bag 120.

In the tank main body 110 of the immersion tank 100A, the coolant 40 is stored in an amount with which the entirety of the electronic device 2 to be installed is immersed. In the immersion tank 100A, even when the electronic device 2 having been installed is removed, or a different electronic device is added, displacement of the liquid height S of the coolant 40 stored in the tank main body 110 is suppressed.

For example, when the electronic device 2 is removed, the air bags 120 at the installation location of the electronic device 2 having been deflated due to the installation of the electronic device 2 are urged by the urging forces of the inner springs 122 because of removal of the pressure applied by the weight of the electronic device 2, and the air is taken into the air bags 120 through the air vents 121. Thus, the air bags 120 are inflated. During the inflation, collapsing of the air bags 120 caused by the pressure of the coolant 40 is suppressed by the inner support units 123. The guide units 130 that surround the air bags 120 having been deflated and pushed downward by the weight of the electronic device 2 are urged by the urging forces of the springs 132 (FIG. 8B) when the pressure applied by the weight of the electronic device 2 is removed. Thus, the guide units 130 also ascend. Each of the air bags 120 being inflated is guided by the ascending guide units 130, thereby, during the inflation, bending or falling of the air bags 120 is suppressed.

In the immersion tank 100A, the volume of the removed electronic device 2 is replaced with the volume of the air bags 120 inflated when the electronic device 2 is removed (volume increased by the inflation). In the immersion tank 100A, the number of air bags 120 and the size of each of the air bags 120 at the location where the electronic device 2 is to be removed are adjusted so that the volume added by the inflation of the air bags 120 (difference in volume between the deflated state and the inflated state) is the same as or equal to the volume of the electronic device 2 to be removed. This suppresses lowering of a liquid level of the coolant 40 caused by the removal of the electronic device 2. This also suppresses displacement from the liquid height S before the removal of the electronic device 2.

When the electronic device 2 is added over the plurality of inflated air bags 120, the air bags 120 at the location where the electronic device 2 is added are pushed downward by the weight of the electronic device 2 against the urging forces of the springs 122 in the air bags 120, and the air is discharged through the air vents 121. Thus, the air bags 120 are deflated. During the deflation, collapsing of the air bags 120 caused by the pressure of the coolant 40 is suppressed by the inner support units 123. The guide units 130 surrounding each of the air bags 120 are pushed downward by the weight of the electronic device 2 against the urging forces of the springs 132 (FIG. 8B). Thus, the guide units 130 also descend. Each of the air bags 120 being deflated is guided by the descending guide units 130, thereby, during the deflation, bending or falling of the air bags 120 is suppressed.

In the immersion tank 100A, the volume of the air bags 120 deflated when the electronic device 2 is added (volume reduced by the deflation) is replaced with the volume of the added electronic device 2. In the immersion tank 100A, the number of air bags 120 and the size of each of the air bags 120 at the location where the electronic device 2 is to be added are adjusted so that the volume reduced by the deflation of the air bags 120 (difference in volume between the inflated state and the deflated state) is the same as or equal to the volume of the electronic device 2 to be added. This suppresses rising of the liquid level of the coolant 40 caused by the addition of the electronic device 2. This also suppresses displacement from the liquid height S before the addition of the electronic device 2.

As described above, in the immersion tank 100A, the volume occupied by the air bags 120 in the coolant 40 when the air bags 120 are inflated at the location where the electronic device 2 is removed or added and the volume occupied by the removed or added electronic device 2 in the coolant 40 are replaced with each other. This may effectively suppress the displacement of the liquid height S of the coolant 40 stored in the tank main body 110 of the immersion tank 100A. Since the displacement of the liquid height S of the stored coolant 40 is able to be suppressed by utilizing the inflation and deflation of the air bags 120 when the electronic device 2 is removed and added, for example, the additional supply or discharge of the coolant 40, the increase in size of the tank main body 110, and the increase in amount of the coolant 40 to be used may be suppressed. Thus, the immersion tank 100A that has a small size and light weight and that is made at a low cost may be realized.

Third Embodiment

An example of an immersion tank that allows adjustment of the air bags 120 as described according to the above-described second embodiment is described below as a third embodiment.

Figure 9:
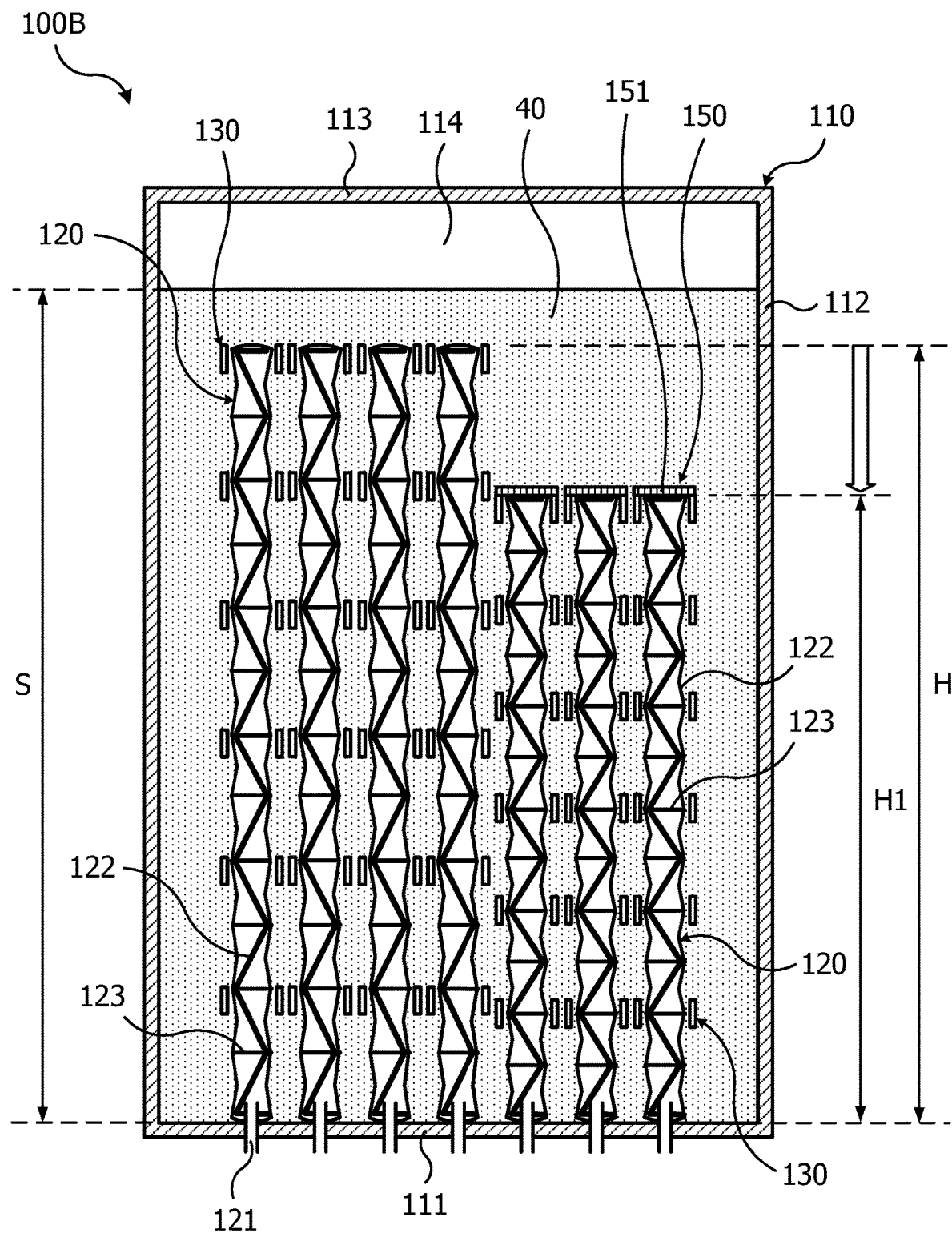
FIG. 9 illustrates an example of an immersion tank according to a third embodiment (No. 1)
Figure 10:
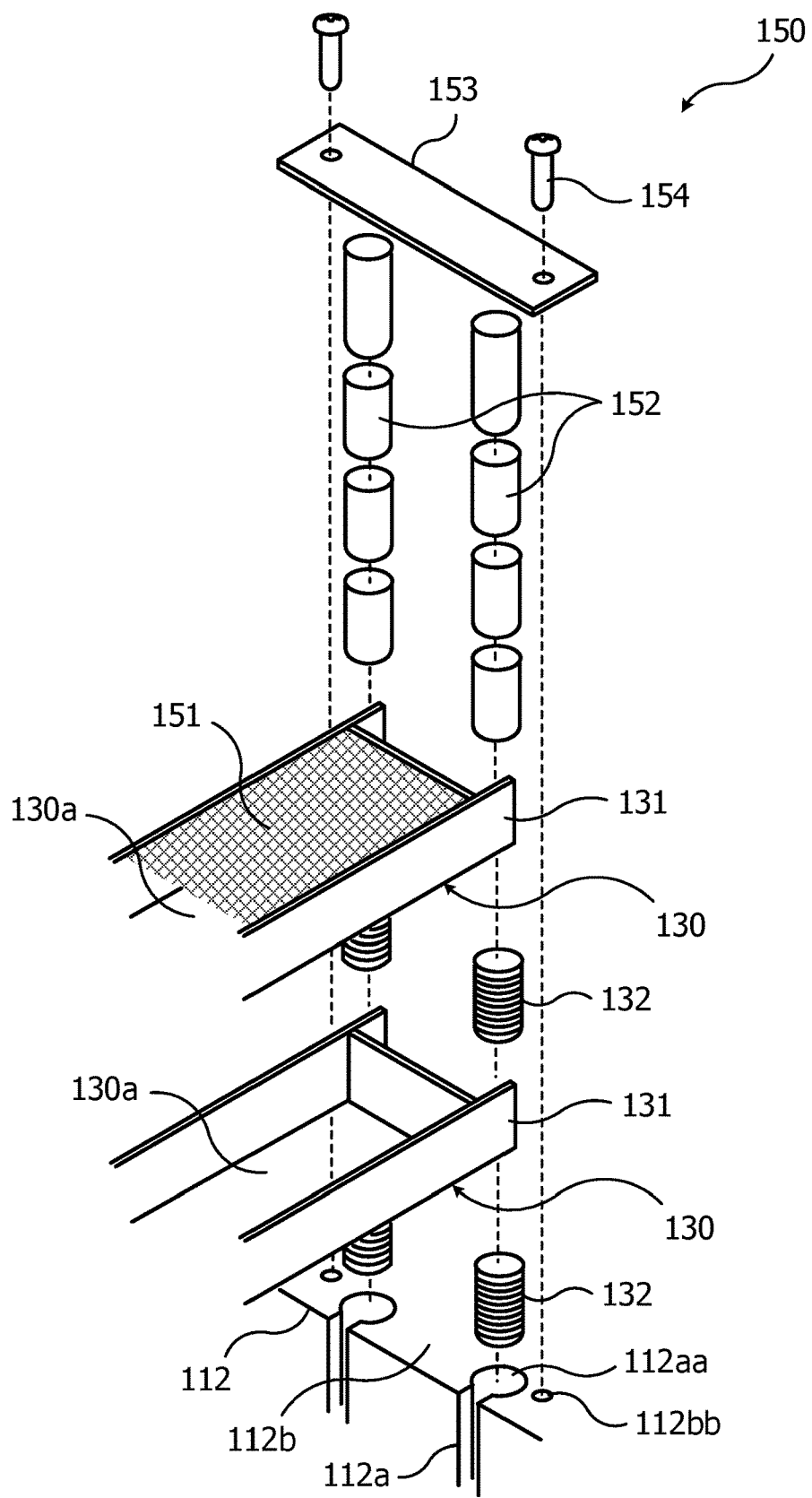
FIG. 10 illustrates the example of the immersion tank according to the third embodiment (No. 2)

FIGS. 9 and 10 illustrate the example of the immersion tank according to the third embodiment. FIG. 9 schematically illustrates the section of a main part of the example of the immersion tank. FIG. 10 is a schematic exploded perspective view of a main part of the example of the immersion tank.

A immersion tank 100B illustrated in FIG. 9 includes an adjustment unit 150 that adjusts an upper end position (height) H1 of the air bags 120 in the inflated state to a position lower than an upper end position (height) H of the air bags 120 inflated to the maximum when the electronic device is not installed (or before the electronic device is installed). In such a point, the immersion tank 100B is different from the immersion tank 100A described according to the second embodiment (FIGS. 5 to 8B).

An example of the structure of the adjustment unit 150 of the immersion tank 1008 is described with reference to FIG. 10.

In the immersion tank 1008, as illustrated in FIG. 10, a cover 151 such as a wire mesh is used to close an opening 130*a* through which the air bag 120 would otherwise pass of the upper most guide unit 130 out of the guide units 130 (FIG. 9) surrounding the air bag 120 the upper end position H1 of which is to be adjusted. The springs 132 that urge the uppermost guide unit 130 upward are inserted into the grooves 112*a* of the side wall portions 112 of the tank main body 110, and the fitting portions 131 of the uppermost guide unit 130 the opening 130*a* of which is closed by the cover 151 are fitted into the grooves 112*a* into which the springs 132 are inserted. A group of the guide units 130 below the uppermost guide unit 130 are similarly provided in the tank main body 110 such that the fitting portions 131 of these guide units 130 are fitted into the grooves 112*a* of the side wall portions 112 into which the springs 132 are inserted. The uppermost guide unit 130 is fitted with the inserted springs 132 inserted as described above.

Pairs of spacers 152 for height adjustment as illustrated in FIG. 10 are inserted into a pair of the grooves 112*a* of each of the side wall portions 112 to which the fitting portions 131 of the uppermost guide unit 130 are fitted. For example, a plurality of pairs of spacers 152 are inserted into the pair of grooves 112*a*. In this case, different pairs of spacers 152 out of the plurality of pairs of spacers 152 do not necessarily have the same height. With the pairs of spacers 152 inserted into the pair of grooves 112*a*, a stopper (pressing member) 153 is fixed by screws 154 to an upper surface 112*b* (screw holes 112*bb* provided therein) of the side wall portion 112.

In this way, the uppermost guide unit 130 is positioned below the upper surface 112*b* of the side wall portion 112 by the height of a pair of the spacers 152 inserted into the pair of grooves 112*a* of the side wall portion 112 (the total height of the pairs of spacers 152 when a plurality of the pairs of spacers 152 are inserted). Thus, ascending of the uppermost guide unit 130 above this position is regulated. Since the opening 130*a* of the uppermost guide unit 130 through which the air bag 120 would otherwise pass is closed by the cover 151, upward inflation of the air bag 120 that is urged upward by the urging force of the spring 122 and inflated is regulated such that the air bag 120 is not inflated beyond the cover 151.

The cover 151 may be formed of any of various materials and may have any of various forms as long as the cover 151 is able to regulate the upward inflation of the air bag 120 beyond the cover 151. However, when it is thought that, for example, the flow of the coolant 40 between the upper side and the lower side of the cover 151 is blocked by the cover 151 and this blocking influences cooling of the installed electronic device, it is desirable that the cover 151 such as a wire mesh having holes that allow the coolant 40 to flow between the upper side and the lower side thereof be used.

In the immersion tank 1008, the adjustment unit 150 as described above is used. Thus, the upper end position H1 of the air bag 120 the inflation of which is regulated by the cover 151 is adjusted to a position lower than the upper end position H of the air bag 120 the inflation of which is not regulated by the cover 151 and which is inflated to the maximum. The air bags 120 thus adjusted are provided in the tank main body 110 in which the coolant 40 in the liquid height of S is stored as illustrated in FIG. 9.

In the immersion tank 100B, the height and the number of the pairs of spacers 152 inserted into the pair of the grooves 112*a* of the side wall portion 112 of the tank main body 110 (FIG. 10) are adjusted, thereby adjusting the upper end position H1 of the air bag 120 the inflation of which is adjusted by the cover 151. The upper end position H1 (for example, the height and the number of the pair of spacers 152) of the air bag 120 the inflation of which is regulated by the cover 151 is set in accordance with the size and the volume of the electronic device installed over the air bag 120.

Out of the electronic devices that are the objects of cooling immersed in the coolant 40, an electronic device may occupy the volume in the coolant 40 different from the volume of another electronic device having the same external shape because of the difference in mounting density of device units or the like between the electronic devices. The deflation amount of the air bag 120 that is deflated when the electronic device is installed is determined in accordance with the external dimensions of the electronic device to be installed. Accordingly, the volume occupied by the electronic device in the coolant 40 does not coincide with the volume of the air bag 120 deflated by this electronic device ((volume reduced by the deflation) depending on the external dimensions and the mounting density of the electronic device. This may displace the liquid height S of the coolant 40. Alternatively, the volume occupied by the removed electronic device in the coolant 40 does not coincide with the volume of the air bag 120 inflated by the removal (volume increased by the inflation) depending on the external dimensions and the mounting density of the electronic device. This may displace the liquid height S of the coolant 40.

In view of the above-described problem, in the immersion tank 1008, the upper end position H1 of the air bag 120 in the inflated state before the electronic device is installed is adjusted in advance in accordance with the mounting density of the electronic device to be installed and immersed in the coolant 40, in other words, the volume (effective volume) to be occupied by the electronic device in the coolant 40. For example, when the mounting density of an electronic device out of the objects of cooling including an electronic device group having the same outer dimensions and different mounting densities is low, the air bag 120 at the location where this electronic device with the low mounting density is installed is adjusted by the adjustment unit 150 such that the upper end position H1 in the inflated state is lower than the upper end position H for the maximum inflation. Displacement from the liquid height S before the installation of the electronic device is suppressed when the volume occupied in the coolant 40 by the electronic device with the low mounting density and the small effective volume coincides with the reduction of the volume of the air bag 120 that is deflated to a position determined by the outer dimensions of this electronic device when this electronic device is installed. When this electronic device is removed, the inflation of the air bag 120 due to the removal is regulated to the adjusted upper end position H1. When the increase in the volume of the air bag 120 due to the inflation coincides with the volume occupied by the electronic device in the coolant 40, displacement from the liquid height S before removal of the electronic device is suppressed.

In this way, in the immersion tank 100B, the upper end position H1 of the air bag 120 in the inflated state before the installation of the electronic device is adjusted in advance in accordance with the mounting density of the electronic device that is the object of cooling. Thus, displacement of the liquid height S of the coolant 40 is suppressed.

In the immersion tank 100B, the air bag 120 is adjusted to the upper end position H1 lower than the upper end position H for the maximum inflation. For example, the volume is adjusted so as to be reduced from the volume for the maximum inflation. Accordingly, it is preferable that the volume of the air bag 120 be preferably set to be large before the adjustment and the upper end position H1 be adjusted, as described above, by changing the height and the number of the pairs of spacers 152 in accordance with the mounting density of the electronic device to be installed over the air bag 120.

Fourth Embodiment

An example of an immersion tank in which a single air bag 120 as described according to the above-described second embodiment is divided into a plurality of air bags 120 is described below as a fourth embodiment.

Figure 11:
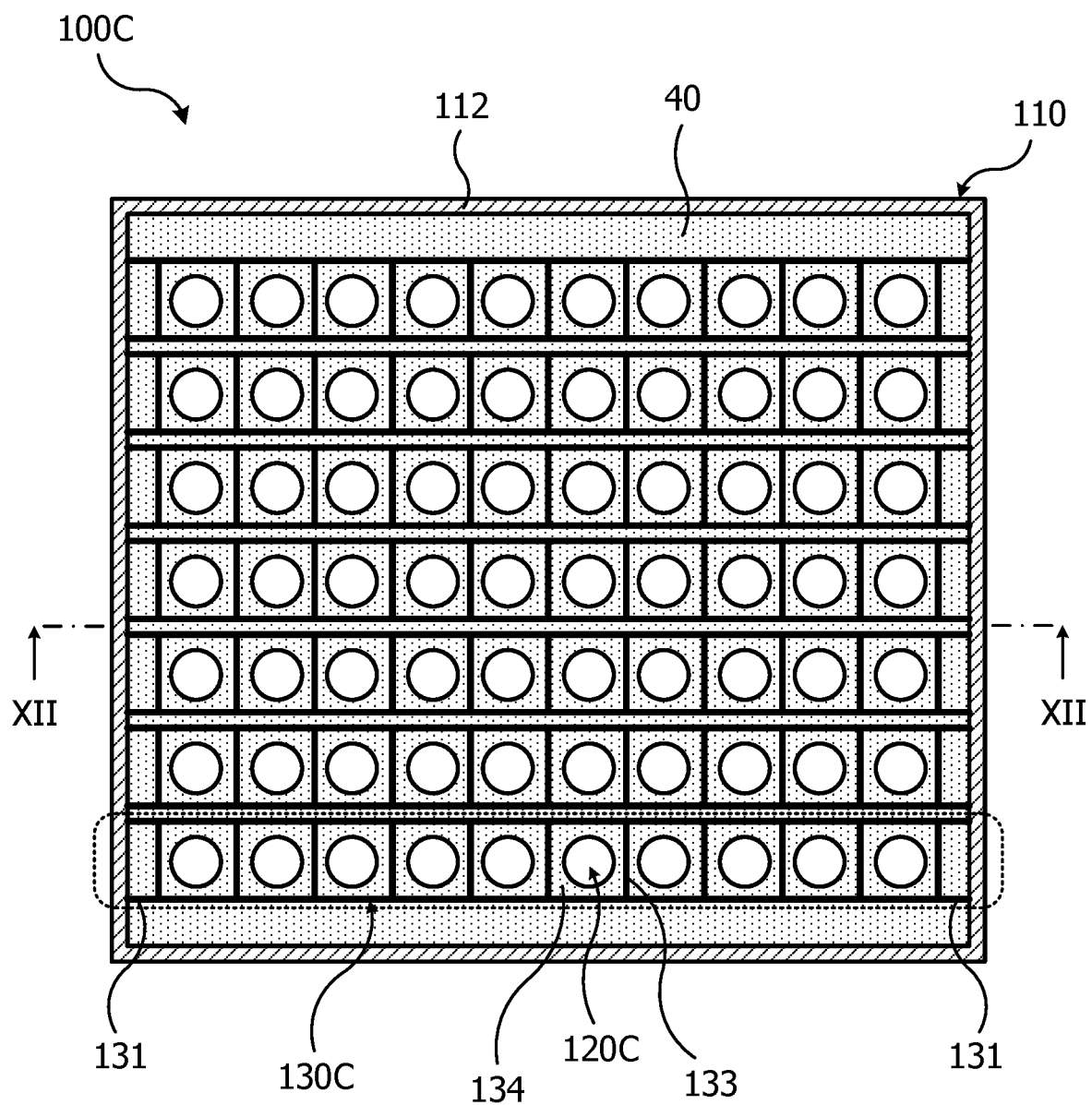
FIG. 11 illustrates an example of an immersion tank according to a fourth embodiment (No. 1)
Figure 12:
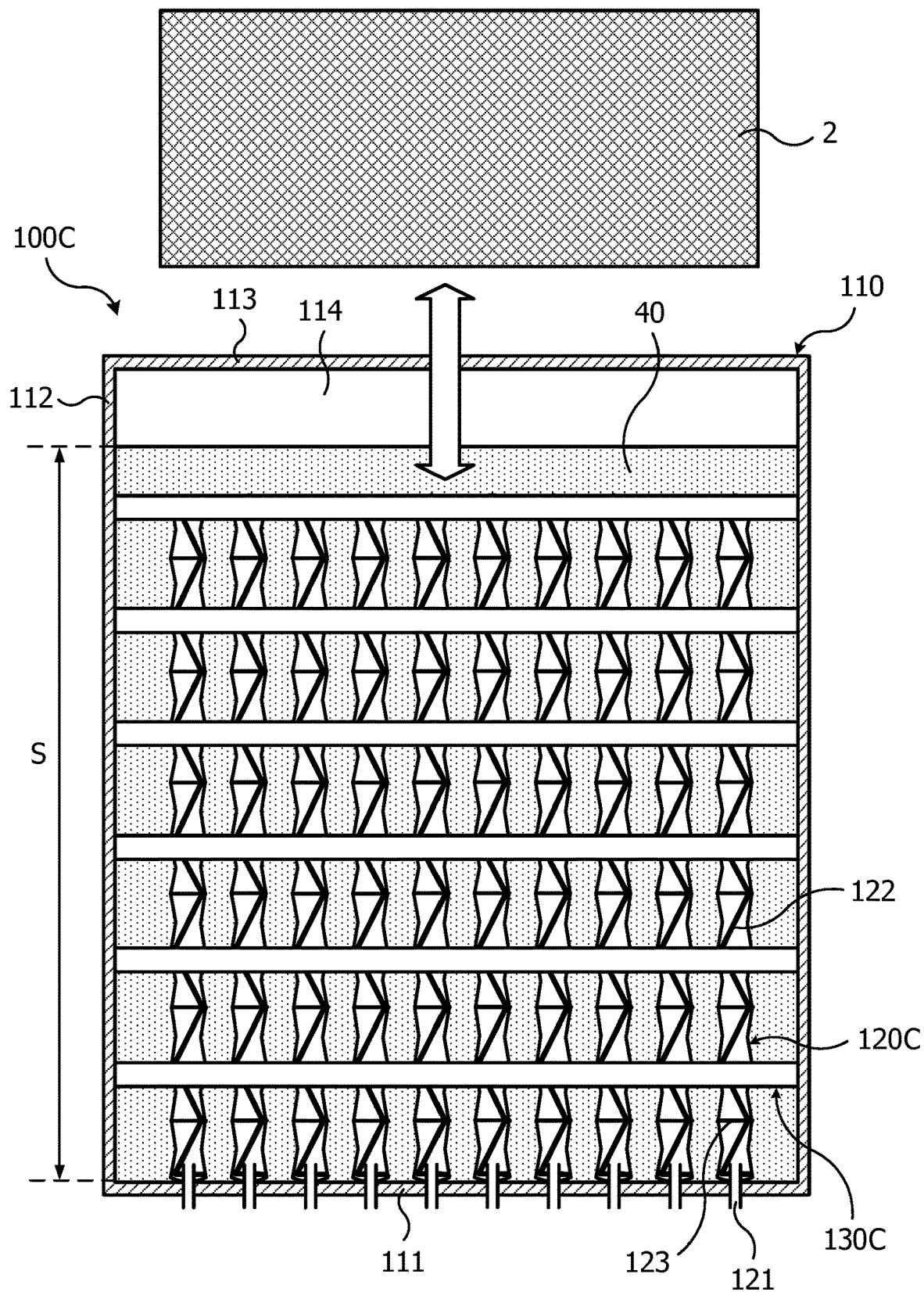
FIG. 12 illustrates the example of the immersion tank according to the fourth embodiment (No. 2)
Figure 13:
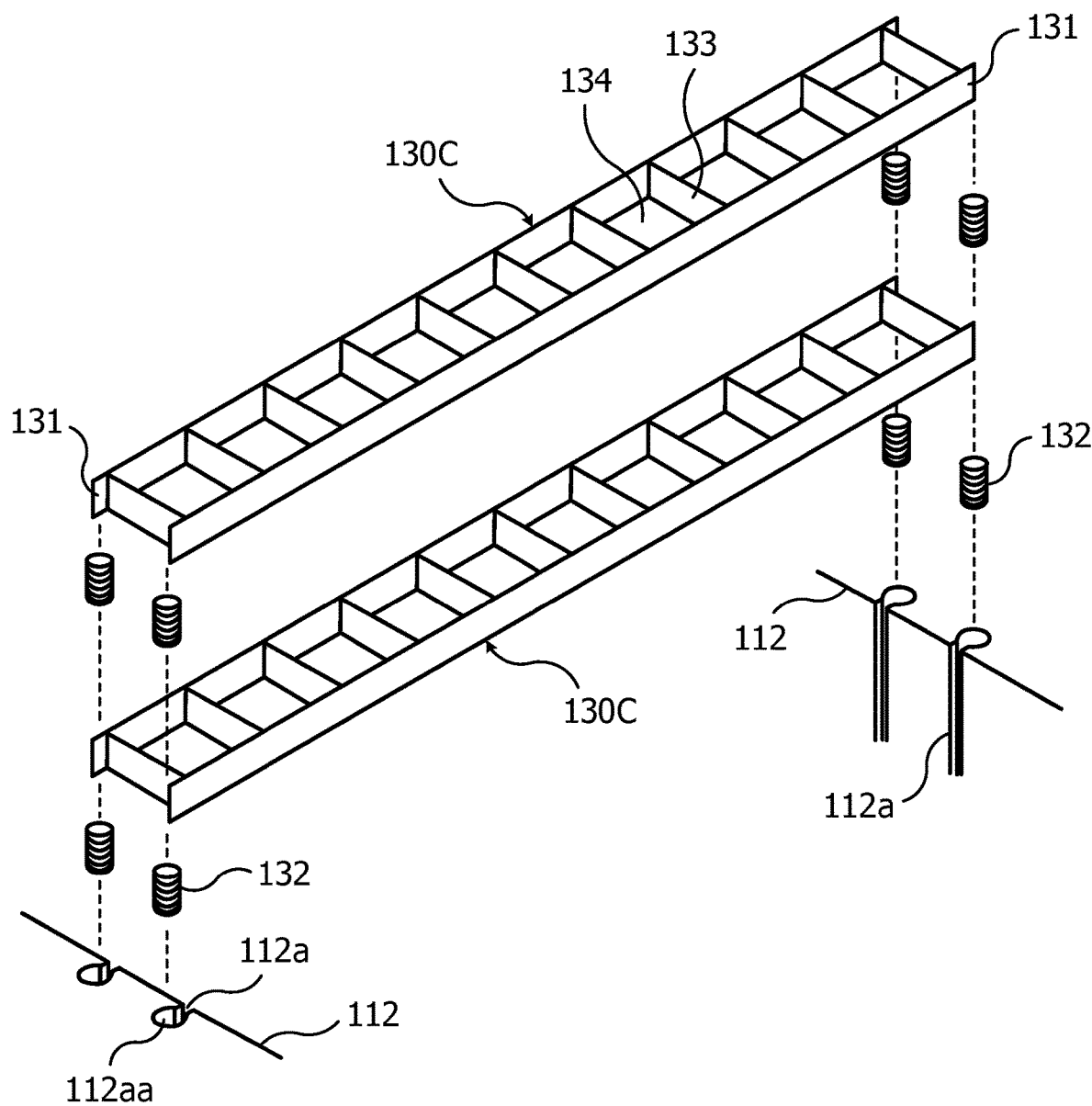
FIG. 13 illustrates the example of the immersion tank according to the fourth embodiment (No. 3)

FIGS. 11 to 13 illustrate the example of the immersion tank S according to the fourth embodiment. FIG. 11 is a schematic plan view of a main part of the example of the immersion tank. FIG. 12 schematically illustrates the section of the main part of the example of the immersion tank. FIG. 12 schematically illustrates the section taken along line XII-XII illustrated in FIG. 11. FIG. 13 is a schematic exploded perspective view of a main part of the example of the immersion tank.

An immersion tank 100C illustrated in FIGS. 11 and 12 includes guide units 130C having a plurality of divided regions 134 partitioned and divided by partitions 133 and a plurality of air bags 120C having such a size that the air bags 120C pass through the divided regions 134 of the guide units 130C. In such a point, the immersion tank 100C is different from the immersion tank 100A described according to the second embodiment (FIGS. 5 to 8B).

The immersion tank 100C uses the guide units 130C in each of which the opening 130a of the guide unit 130 according to the second embodiment is partitioned by the partitions 133 so as to divide the opening 130a into the plurality of (for example, ten) divided regions 134 as illustrated in FIGS. 11 to 13. As illustrated in FIG. 13, the fitting portions 131 provided in the guide unit 130C are fitted into the grooves 112a provided in the side wall portions 112 of the tank main body 110. The springs 132 that urges the guide unit 130C upward are inserted into the grooves 112a of the side wall portions 112. The fitting portions 131 of the guide unit 130C are fitted over the springs 132. The insertion of the springs 132 and the fitting of the fitting portions 131 of the guide unit 130C into the grooves 112a of the side wall portions 112 are repeatedly performed so as to arrange a plurality of (for example, six) guide units 130C in the height direction of the tank main body 110 as illustrated in FIG. 12. In a set of the guide units 130C arranged in the height direction, the divided regions 134 of a guide unit 130 are superposed on the respective divided regions 134 of another guide unit 130 in plan view. In the immersion tank 100C, sets of the guide units 130C arranged in the height direction as illustrated in FIG. 12 are arranged in a plurality of rows (for example, seven rows) in the planar direction of the tank main body 110 as illustrated in FIG. 11.

In the immersion tank 100C, the air bags 120C as illustrated in FIGS. 11 and 12 are used. The air bag 120 described according to the second embodiment is divided into the plurality of (the number of divided regions 134 of each of the guide units 130C, for example, ten) air bags 120C. For example, a bellows-type bag body which is stretchable in the up-down direction, a bag body formed of a stretchable material (such as an elastic body), or the like is used as each of the air bags 120C. The air bags 120C are provided so as to pass through the superposed divided regions 134 of each of the sets of guide units 130C arranged in the height direction of the tank main body 110. The air bags 120C each have the air vent 121 at a bottom portion thereof. The air bag 120C includes therein the spring 122 that urges the air bag 120C upward and the support units 123 that suppress collapsing of the air bag 120C caused by external pressure.

In the immersion tank 100C, when the electronic device 2 is not installed (or before the electronic device 2 is installed), the set of the guide units 130C (six guide units 130C illustrated in FIG. 12) arranged in the height direction are urged upward by the urging forces of the springs 132 inserted into the grooves 112a of the side wall portions 112, and the set of the guide units 130C ascend. When the electronic device 2 is installed over the uppermost guide unit 130C of the set of guide units 130C arranged in the height direction, the set of the guide units 130C are pushed by the weight of the electronic device 2 against the urging forces of the springs 132, and the set of the guide units 130C descend.

When the electronic device 2 is not installed, a set of the air bags 120C (ten air bags 120C illustrated in FIG. 12) in a row passing through groups of the superposed divided regions 134 of the set of guide units 130C arranged in the height direction are urged upward by the urging forces of the springs 122, and the air is supplied through the air vents 121. Thus, the set of the air bags 120C are inflated. When the electronic device 2 is installed over the set of air bags 120C in a row, these air bags 120C are pushed by the weight of the electronic device 2 against the urging forces of the springs 122, and the air is discharged through the air vents 121. Thus, the air bags 120C are deflated.

The set of guide units 130C arranged in the height direction ascend and descend as the set of air bags 120C in a row are inflated and deflated, thereby guiding the inflation and deflation of the set of air bags 120C in a row.

In the immersion tank 100C, the number of air bags 120C in a row provided in advance in the tank main body 110 may be adjusted in accordance with the mounting density (effective volume) of the electronic device 2 (the number of the divided regions 134 of the guide units 130C through which the air bags 120C pass may be similarly adjusted).

Also in the immersion tank 100C, the volume occupied by the air bags 120C (the set of air bags 120C in a row are regarded as a unit) in the coolant 40 when the air bags 120C are inflated at the location where the electronic device 2 is removed or added and the volume occupied by the removed or added electronic device 2 in the coolant 40 are replaced with each other. Thus, displacement of the liquid height S of the coolant 40 stored in the tank main body 110 is suppressed.

Fifth Embodiment

A first example of an immersion tank that allows adjustment of the air bags 120C as described according to the above-described fourth embodiment is described below as a fifth embodiment.

Figure 14A:
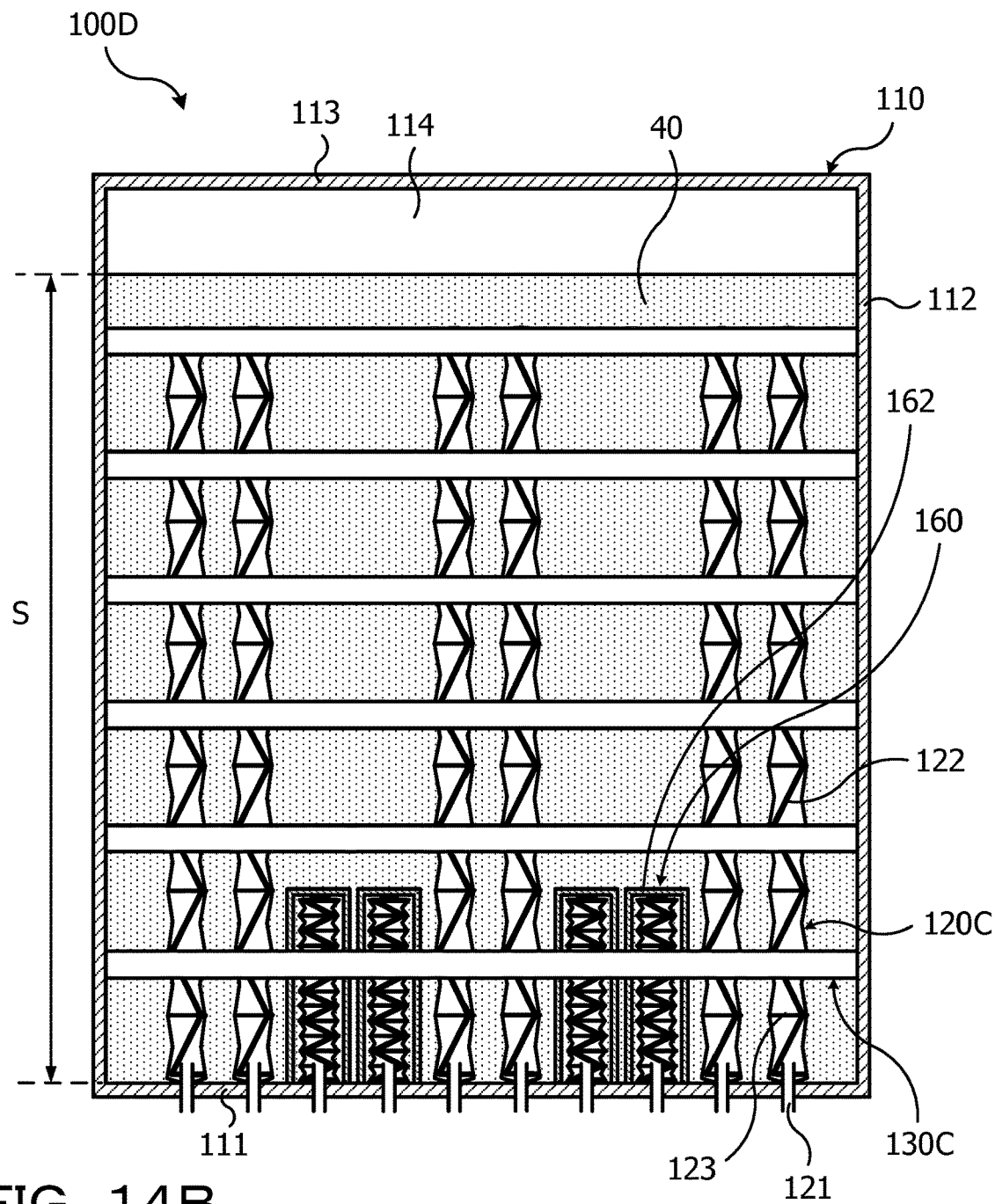
FIGS. 14A and 14B illustrate an example of an immersion tank according to a fifth embodiment (No. 1)
Figure 14B:
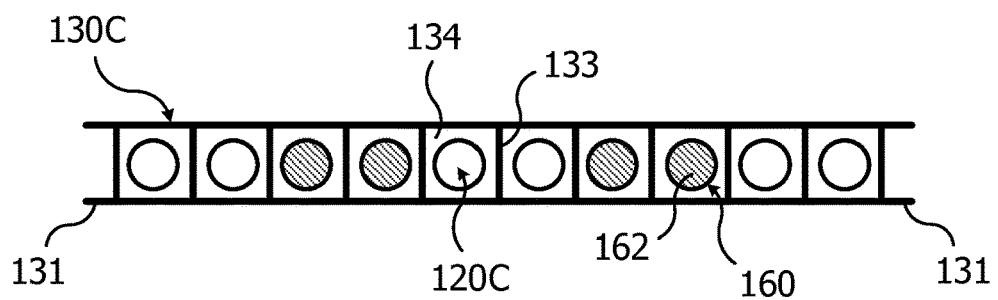
Figure 15:
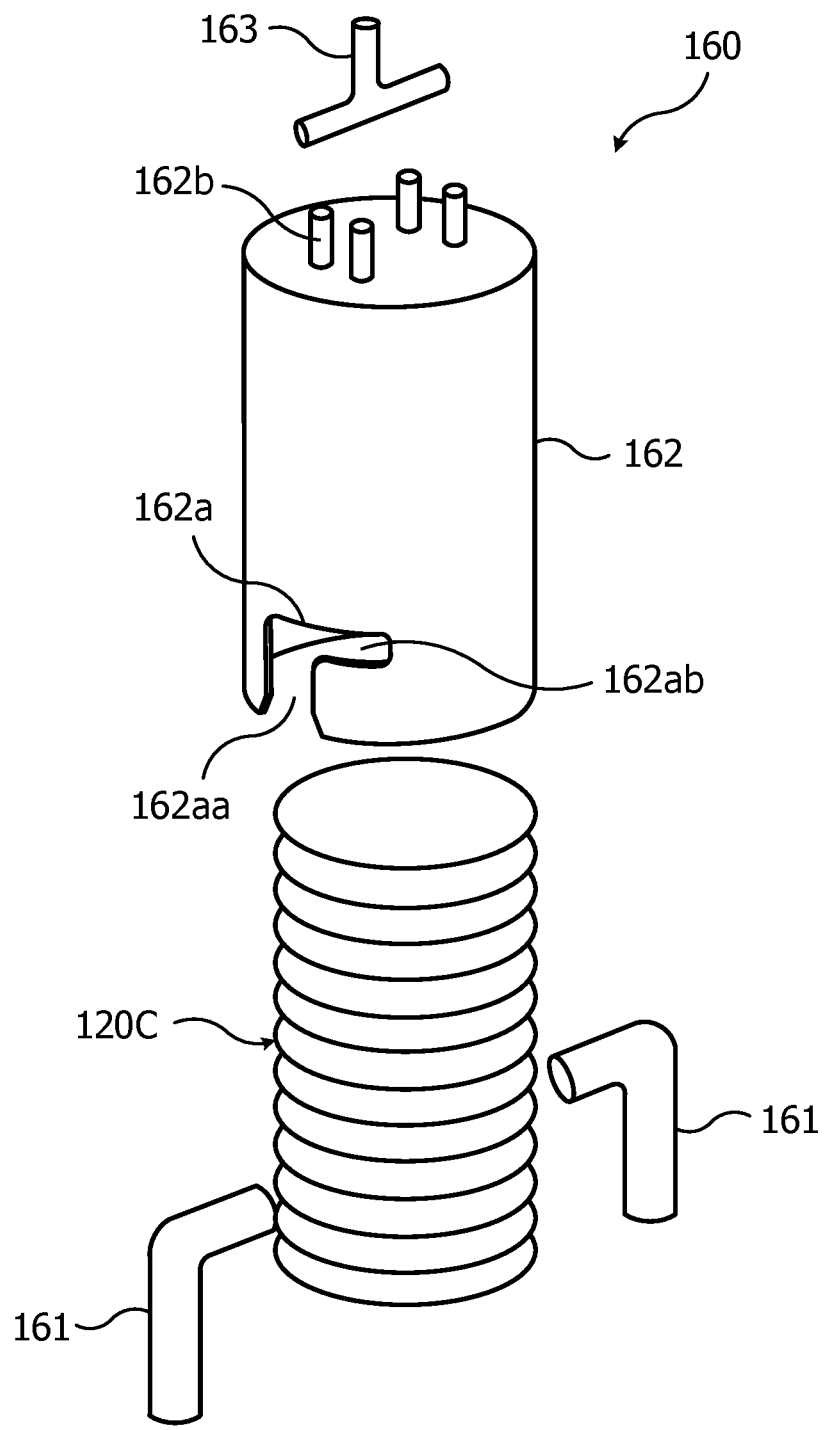
FIG. 15 illustrates the example of the immersion tank according to the fifth embodiment (No. 2)

FIGS. 14A, 14B, and 15 illustrate the example of the immersion tank according to the fifth embodiment. FIG. 14A schematically illustrates the section of a main part of the example of the immersion tank. FIG. 14B is a plan view schematically illustrating a main part of an example of the guide unit in which a set of air bags in a single row and the divided regions surrounding the air bags are provided. FIG. 15 is a schematic exploded perspective view of a main part of an example of an adjustment unit provided in the immersion tank.

In the immersion tank 100C described according to the fourth embodiment, when the set of the air bags 120C in a row are regarded as a unit of the inflation and deflation, similar situations described according to the third embodiment may occur depending on the number of air bags 120C in a row and the type of the electronic device that is the object of cooling. For example, depending on the mounting density (effective volume) of the electronic device that is the object of cooling, the volume occupied in the coolant 40 by the installed electronic device does not necessarily coincide with the reduction of the volume of a group of the air bags 120C that are deflated to a position determined by the outer dimensions of this electronic device when this electronic device is installed. Alternatively, the volume occupied in the coolant 40 by the removed electronic device does not necessarily coincide with an increase in the volume of a group of the air bags 120C that are inflated from a position determined by the external dimensions of the electronic device when the electronic device is removed.

For such situations, in an immersion tank 100D according to the fifth embodiment, out of the air bags 120C provided in the tank main body 110, the air bag 120C or the air bags 120C in use or not in use are able to be adjusted afterward by using adjustment units 160 in accordance with the mounting density of the electronic device. In such a point, the immersion tank 100D is different from the immersion tank 100C described according to the fourth embodiment (FIGS. 11 to 13).

In the immersion tank 100D, the number of air bags 120C in use or not in use is adjusted on an air-bag-120C-by-air-bag-120C basis. For example, as illustrated in FIGS. 14A and 14B, out of a set of ten air bags 120C in a row, six air bags 120C are used and four air bags 120C that remain are not used in accordance with the mounting density of the electronic device to be immersed in the coolant 40. By adjusting the number of air bags 120C as described above, the volume of the electronic device to be installed coincides with the reduction of the volume of the group of the air bags 120C that are deflated when the electronic device is installed. Alternatively, the volume of the electronic device to be removed coincide with the increase in the volume of the group of air bags 120C that are inflated by the removal of the electronic device. Thus, displacement of the liquid height S of the stored coolant 40 is suppressed.

In order not to use the four air bags 120C out of the set of ten air bags 120C in the row as illustrated in the example in FIGS. 14A and 14B, the adjustment units 160 as illustrated in FIGS. 14A, 14B, and 15 are used. As illustrated in FIG. 15, each of the adjustment units 160 includes L-shaped hooking portions 161 and a cap-shaped stopper (pressing member) 162. The hooking portions 161 are provided outside the air bag 120C at the bottom portion 111 of the tank main body 110. The stopper (pressing member) 162 has a size with which the air bag 120C in the deflated state is able to be contained. The stopper 162 has grooves 162a and projections 162b. The grooves 161a are provided in a side wall portion of the stopper 162. The hooking portions 161 are fitted into the grooves 162a. The projections 162b are provided at a ceiling portion of the stopper 162 and allows a rotating tool 163 to push and rotate the stopper 162. Each of the grooves 162a has a groove 162aa and a groove 162ab. The hooking portions 161 are fitted into the grooves 162aa when the stopper 162 is disposed over the air bag 120C. The grooves 162ab are bent from the grooves 162aa and allow fitting of the hooking portions 161 thereinto when the stopper 162 disposed over the air bag 120C is rotated.

In the immersion tank 100D, the stopper 162 or the stoppers 162 are disposed over the air bag 120C or the air bags 120C not in use in the inflated state over the bottom portion 111 of the tank main body 110. The rotating tool 163 is fitted into the projections 162b on the ceiling portion of each of the stoppers 162, the stopper 162 is pushed toward the bottom portion 111 by using the rotating tool 163, and the air bag 120C is deflated. The grooves 162aa of the stopper 162 are fitted onto the hooking portions 161 at the bottom portion 111, and from this state, the rotating tool 163 is used to rotate the stopper 162, thereby the hooking portions 161 are fitted into the grooves 162ab of the stopper 162 bent from the grooves 162aa. Thus, the stopper 162 is secured to the hooking portions 161, and the air bag 120C not in use is held in the deflated state.

The adjustment units 160 are used as described above to hold, in the deflated state, the air bags 120C not in use which are a group of four air bags 120C out of the set of ten air bags 120C in the raw in this example. With the group of air bags 120C not in use held in the deflated state, a change in volume occurring when a group of air bags 120C in use are inflated and deflated coincides with the effective volume of the electronic device that is the object of cooling. Thus, displacement of the liquid height S of the stored coolant 40 is suppressed.

In the immersion tank 100D, since the number of air bags 120C not in use is able to be adjusted on an air-bag-120C-by-air-bag-120C basis, adjustment for the mounting density of the electronic device that is the object of cooling is able to be accurately made. In the immersion tank 100D, the ratio between the air bags 120C not in use and in use does not vary within a range in which the air bag 120C or the air bags 120C in use are inflated and deflated. Accordingly, displacement of the liquid height S of the coolant 40 may be suppressed without consideration of the external dimensions of the electronic device. In the immersion tank 100D, displacement of the liquid height S of the coolant 40 may be suppressed while the electronic device is moved into and from the coolant 40.

In the immersion tank 100D, the adjustment unit 150 (FIGS. 9 and 10) described according to the third embodiment may be used to regulate the ascending of the uppermost guide unit 130C, thereby adjusting the upper end position of the air bags 120C in use in a row before the installation of the electronic device to a lower position than that for the maximum inflation. When such adjustment is further made, adjustment for the mounting density of the electronic device that is the object of cooling may be made.

Sixth Embodiment

A second example of the immersion tank that allows adjustment of the air bags 120C as described according to the above-described fourth embodiment is described below as a sixth embodiment.

Figure 16:
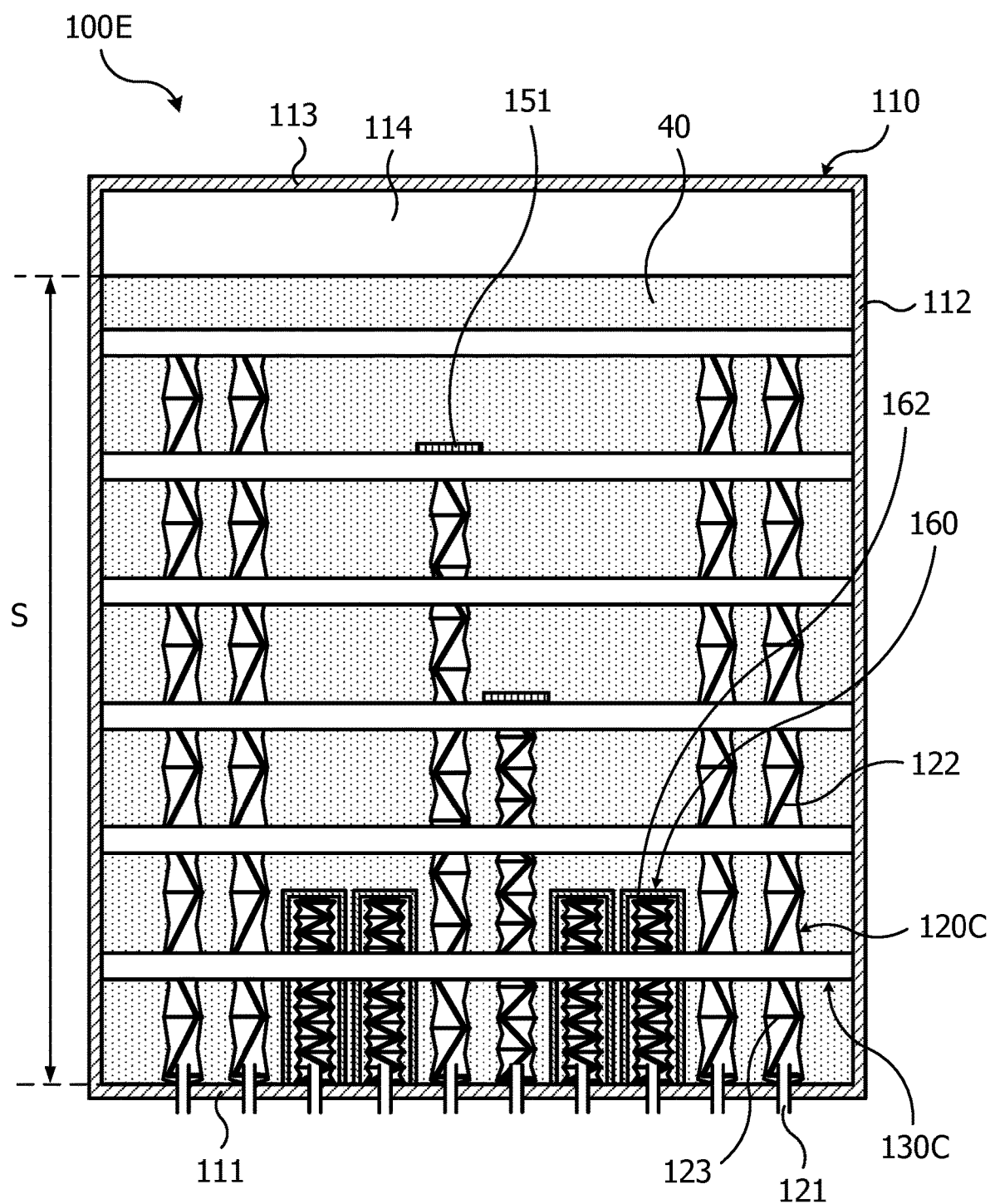
FIG. 16 illustrates an example of an immersion tank according to a sixth embodiment (No. 1)
Figure 17:
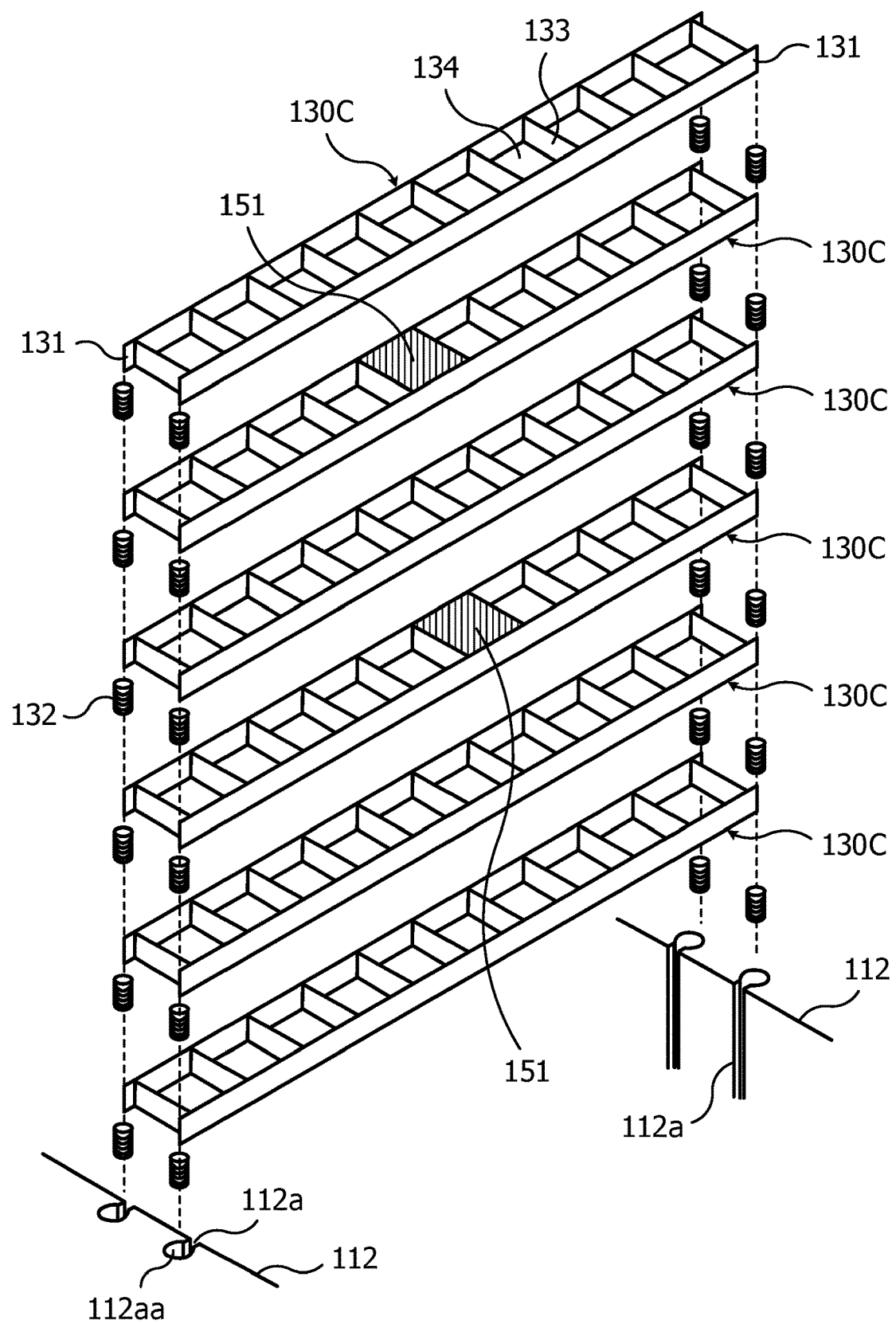
FIG. 17 illustrates the example of the immersion tank according to the sixth embodiment (No. 2)

FIGS. 16 and 17 illustrate the example of the immersion tank according to the sixth embodiment. FIG. 16 schematically illustrates the section of a main part of the example of the immersion tank. FIG. 17 is a schematic exploded perspective view of a main part of an example of the guide units.

In an immersion tank 100E illustrated in FIG. 16, the number of air bags 120C in use or not in use is adjusted on an air-bag-120C-by-air-bag-120C basis. In the immersion tank 100E, the upper end position of the air bag 120C or the air bags 120C in use before the installation of the electronic device is adjusted to a position lower than the upper end position for the maximum inflation on an air-bag-120C-by-air-bag-120C basis. In such a point, the immersion tank 100E is different from the immersion tank 100D described according to the fifth embodiment (FIGS. 14A, 14B, and 15).

For example, as illustrated in FIG. 16, in the immersion tank 100E, similarly to the immersion tank 100D, the adjustment units 160 (FIG. 15) are used so as to hold in the deflated state the four of the air bags 120C not in use out of the set of ten air bags 120C in a row. Further in the immersion tank 100E, the upper end positions of two of six air bags 120C in use before the installation of the electronic device are adjusted to positions lower than the upper end position for the maximum inflation. As illustrated in FIG. 17, the upper end positions of these two air bags 120C are adjusted by blocking the divided regions 134 at the predetermined positions in the guide units 130C by using the covers 151 such as wire meshes by following the example of the adjustment unit 150 as described according to the third embodiment.

In the example illustrated in FIGS. 16 and 17, for the fifth air bag 120C from the left out of the set of ten air bags 120C in a row, the fifth divided region 134 from the left in the second guide unit 130C from the top is blocked by the cover 151. For the sixth air bag 120C from the left out of the set of ten air bags 120C in a row, the sixth divided region 134 from the left in the fourth guide unit 130C from the top is blocked by the cover 151. In this way, upward inflation of the fifth and sixth air bags 120C from the left beyond the respective covers 151 is regulated.

In this way, in the immersion tank 100E, the number of air bags 120 C not in use is able to be adjusted on an air-bag-120C-by-air-bag-120C basis, and the inflation amount of the air bag 120C or the air bags 120C in use is able to be adjusted on an air-bag-120C-by-air-bag-120C basis. Accordingly, adjustment for the mounting density of the electronic device that is the object of cooling is able to be more accurately made.

Seventh Embodiment

Figure 18:
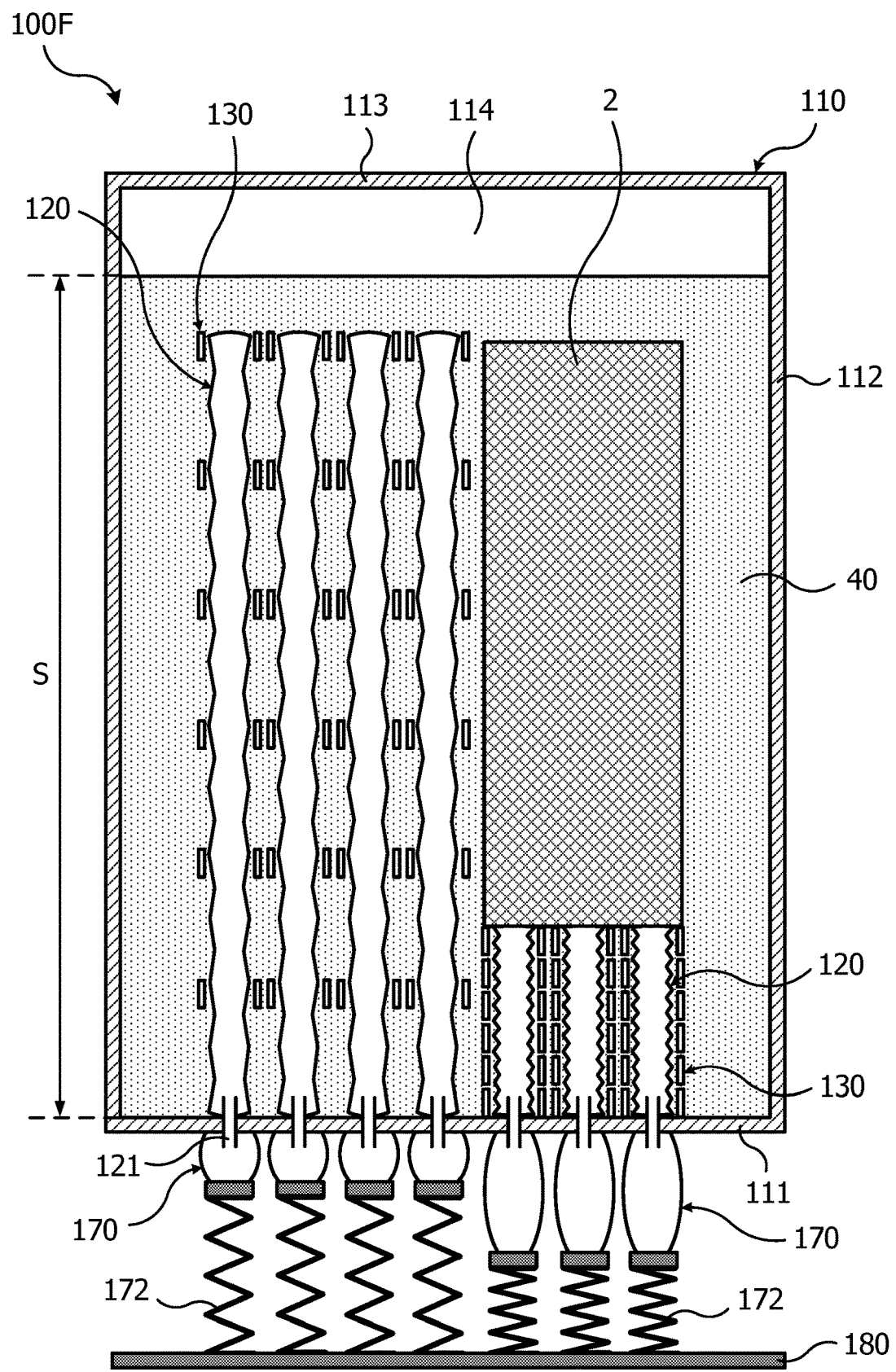
FIG. 18 illustrates an example of an immersion tank according to a seventh embodiment.

FIG. 18 illustrates an example of an immersion tank according to a seventh embodiment. FIG. 18 schematically illustrates the section of a main part of the example of the immersion tank.

An immersion tank 100F illustrated in FIG. 18 includes the air bags 120 provided in the tank main body 110 and air bags 170 that are provided outside the tank main body 110 and that communicate with the air bags 120 through the air vents 121.

The air bags 170 outside the tank main body 110 are provided, for example, below the bottom portion 111 of the tank main body 110. Each of the air bags 170 outside the tank main body 110 is urged toward a corresponding one of the air bags 120 in the tank main body 110 by an urging force of an elastic body such as a spring 172 provided over a support body 180 such as a floor where the immersion tank 100F is disposed. Thus, the air bag 170 is normally subjected to a pressure in a direction in which the air bag 170 is compressed. The spring 172 provided over the support body 180 has the function as a compression unit that compresses the air bag 170 outside the tank main body 110. The air bag 120 over which the electronic device 2 is not installed (or over which the electronic device 2 has not been installed yet) and which is disposed in the tank main body 110 is inflated to a maximum height when the air pushed out from the air bag 170 outside the tank main body 110 is supplied by the compression by the spring 172. When the electronic device 2 is installed over the inflated air bag 120 in the tank main body 110, the air bag 120 is deflated by the weight of the electronic device, and the air pushed out by the deflation of the air bag 120 moves into the air bag 170 outside the tank main body 110. Thus, the air bag 170 are inflated against the urging force of the spring 172.

The immersion tank 100F having the above-described structure is different from the immersion tank 100A described according to the second embodiment (FIGS. 5 to 8B).

As is the case with the immersion tank 100A, in the immersion tank 100F, the air bags 120 are each surrounded by the guide units 130 urged upward by the urging forces of the springs 132 (FIGS. 7, 8A, and 8B). The guide units 130 surrounding the air bag 120 ascend and descend as the air bag 120 is inflated and deflated and guide the air bag 120 during the inflation and deflation. Thus, the guide units 130 suppress bending or falling of the air bag 120.

In the immersion tank 100F, the inflation amount of the air bag 120 before the electronic device 2 is installed is able to be adjusted by, for example, adjusting the urging force (adjusting the wire diameter, the coil diameter, the number of turns, the spring constant, or the like) of a corresponding one of the springs 172.

In the immersion tank 100F, the air bag 120 in the tank main body 110 is inflated when a corresponding one of the air bags 170 outside the tank main body 110 is compressed, and the air bag 170 outside the tank main body 110 is inflated when the air bag 120 in the tank main body 110 is deflated. In the immersion tank 100F, since the air bag 120 in the tank main body 110 is inflated and deflated with such a mechanism, it is not required to provide the spring 122 or the support units 123 in the air bag 120 as described above for the purpose of inflating and deflating the air bag 120 in the tank main body 110. Accordingly, the inner structure of the air bag 120 may be simplified, and the manufacturing cost of the immersion tank 100F may be reduced. However, the spring 122 and the support units 123 as described above may be provided in the air bag 120 in the tank main body 110.

When the spring 122 or the support units 123 are not provided in the air bag 120, the air bag 120 may be inflated and deflated in the left-right direction (width direction) in addition to the up-down direction (height direction).

Figure 19:
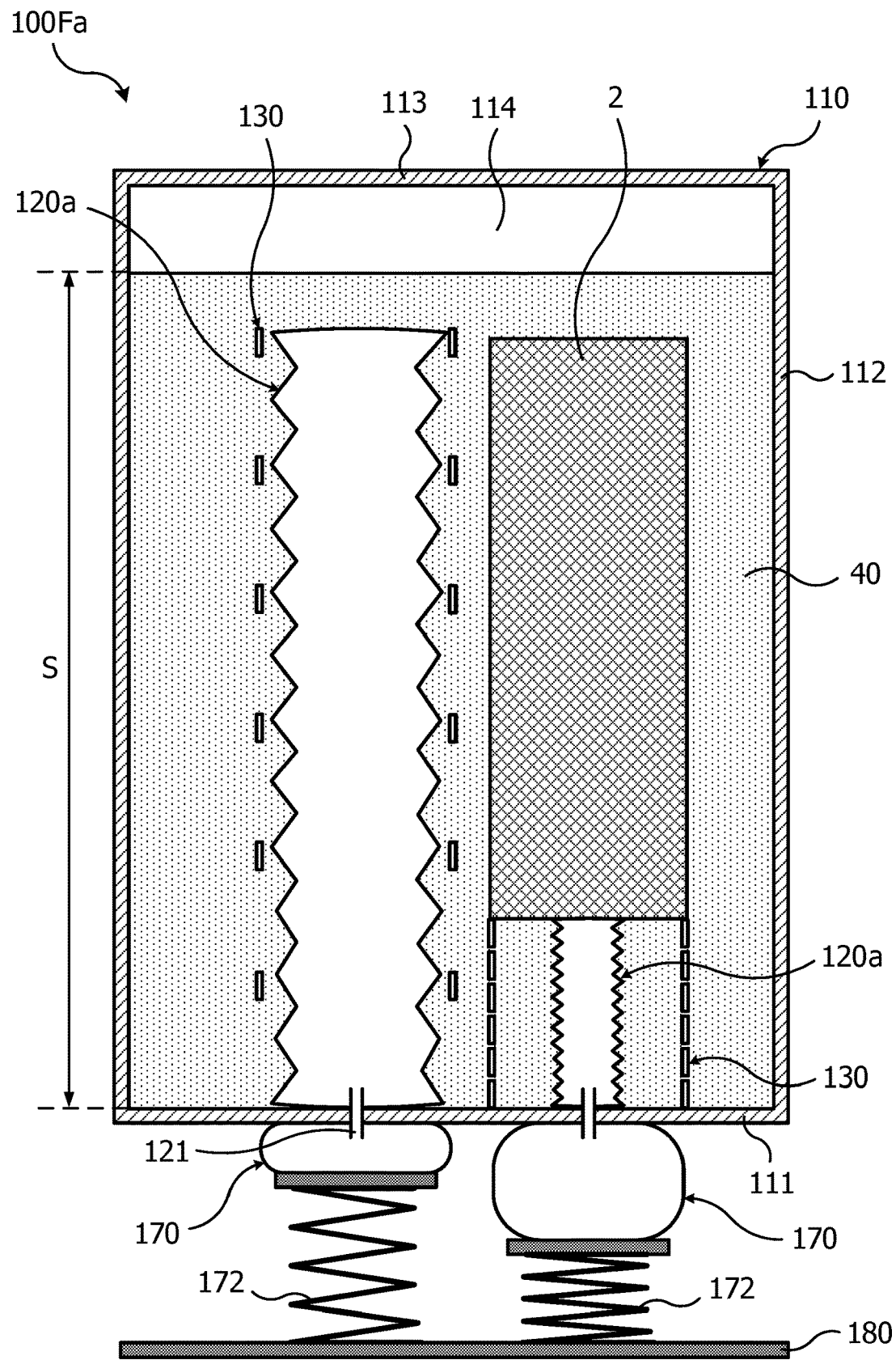
FIG. 19 illustrates a first variant of the immersion tank according to the seventh embodiment.

FIG. 19 illustrates a first variant of the immersion tank according to the seventh embodiment. FIG. 19 schematically illustrates the section of a main part of an example of an immersion tank.

In an immersion tank 100Fa illustrated in FIG. 19, an air bag 120a that is inflated and deflated in the height direction and the width direction is provided in the tank main body 110. In such points, the immersion tank 100Fa is different from the immersion tank 100F.

The air bag 120a over which the electronic device 2 is not installed and which is disposed in the tank main body 110 is inflated to a maximum height and a maximum width when the air pushed out from the air bag 170 outside the tank main body 110 is supplied by the compression applied by the urging force of the spring 172. When the electronic device 2 is installed over the inflated air bag 120a in the tank main body 110, the air bag 120a is deflated in the height direction and the width direction by the weight of the electronic device 2, and the air pushed out by the deflation of the air bag 120a moves into the air bag 170 outside the tank main body 110. Thus, the air bag 170 is inflated against the urging force of the spring 172. The guide units 130 are provided so as to surround the air bag 120a that is inflated and deflated as described above, ascend and descend as the air bag 120a is inflated and deflated, and guide the air bag 120a during the inflation and deflation.

In the immersion tank 100Fa, the inflation amount of the air bag 120a before the electronic device 2 is installed is able to be adjusted by, for example, adjusting the urging force (adjusting the wire diameter, the coil diameter, the number of turns, the spring constant, or the like) of the spring 172.

When a structure without the spring 122 or the support units 123 as described above is employed, the versatility of the shape of the air bag 120a to be used may be increased. For example, as is the case with the immersion tank 100Fa, the air bag 120a that is inflated and deflated in the width direction in addition to the height direction may be used.

The air bag 170 provided outside the tank main body 110 is not necessarily disposed below the bottom portion 111 of the tank main body 110.

Figure 20:
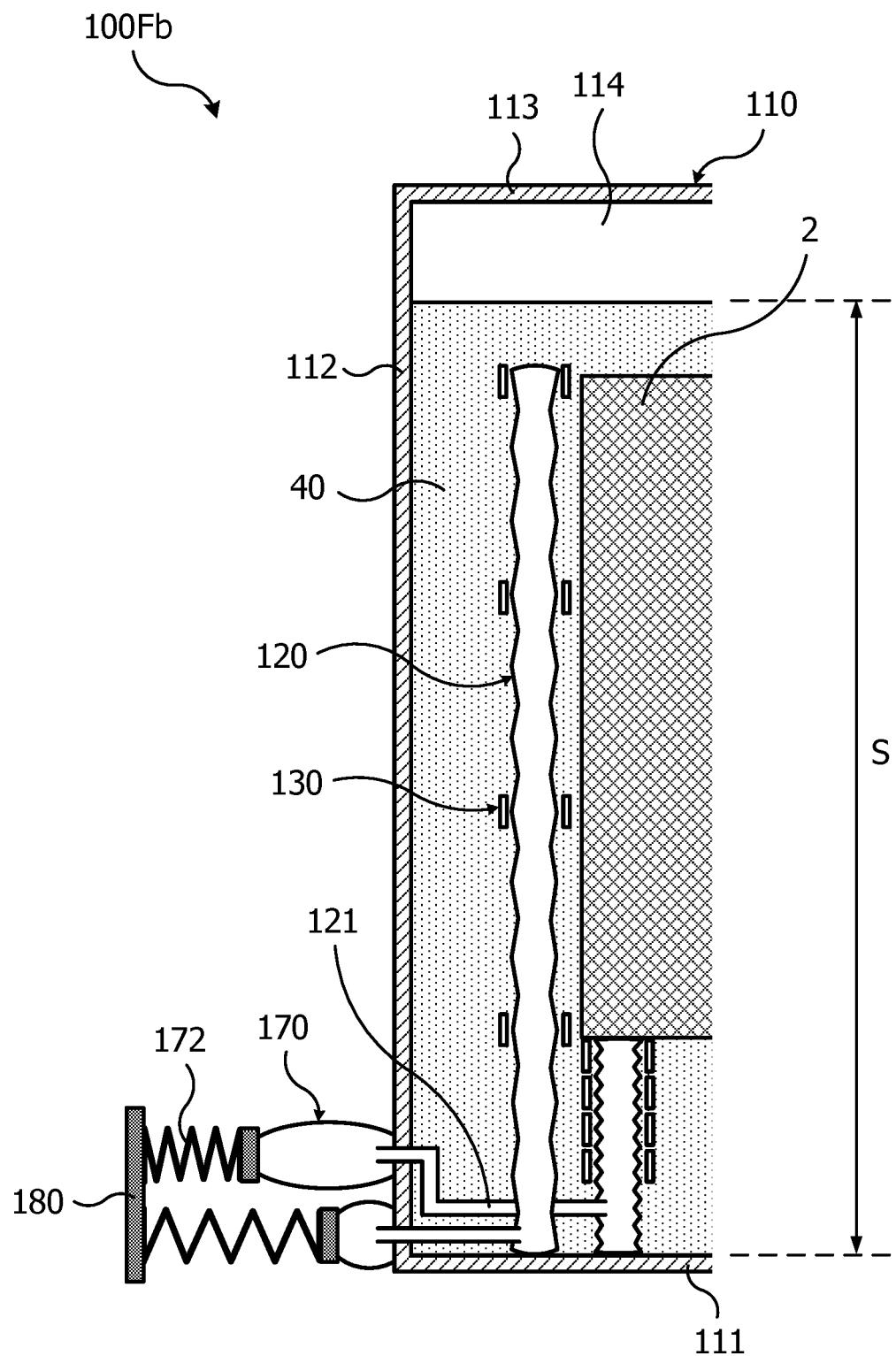
FIG. 20 illustrates a second variant of the immersion tank according to the seventh embodiment.

FIG. 20 illustrates a second variant of the immersion tank according to the seventh embodiment. FIG. 20 schematically illustrates the section of a main part of an example of an immersion tank.

In an immersion tank 100Fb illustrated in FIG. 20, the air bag 170 is provided at a position that is outside the tank main body 110 and beside one of the side wall portions 112. The spring 172 and the support body 180 are provided so as to apply pressure toward the side wall portion 112 to the air bag 170. In such points, the immersion tank 100Fb is different from the immersion tank 100F.

The air vent 121 of the air bag 120 in the tank main body 110 extends to the side wall portion 112 through a flexible or non-flexible pipe, thereby the air bag 120 communicates with the air bag 170 outside the tank main body 110 through the air vent 121. When there is no space below the bottom portion 111 of the tank main body 110 for providing the spring 172 and the support body 180 or it is desirable to provide the spring 172 and the support body 180 beside the side wall portion 112 of the tank main body 110 for layout of the immersion tank 100Fb, the structure as illustrated in FIG. 20 may be adopted.

As the air bag 120 of the immersion tank 100Fb, the air bag 120a that is inflated and deflated in the width direction in addition to the height direction as described for the immersion tank 100Fa (FIG. 19) may be used.

In the immersion tank 100F, 100Fa, 100Fb described according to the seventh embodiment, the air bag 120, 120a may be adjusted for the mounting density (effective volume) of the electronic device 2 by following the example described according to the third embodiment (FIGS. 9 and 10).

In the immersion tank 100F, 100Fa, 100Fb described according to the seventh embodiment, the air bag 120, 120a may be divided into a plurality of air bags by following the example described according to the fourth embodiment (FIGS. 11 and 13). In this case, the divided air bags may be adjusted for the mounting density (effective volume) of the electronic device 2 by following the example described according to the fifth embodiment (FIGS. 14A, 14B, and 15) or the sixth embodiment (FIGS. 16 and 17).

Eighth Embodiment

The immersion tank 1, 100A, 100B, 100C, 100D, 100E, 100F, 100Fa, 100Fb, or the like as described according to the first to seventh embodiments is able to be employed in an immersion cooling device including a mechanism for cooling by circulating the coolant 40. An example of the immersion cooling device is described as an eighth embodiment hereinafter.

Figure 21:
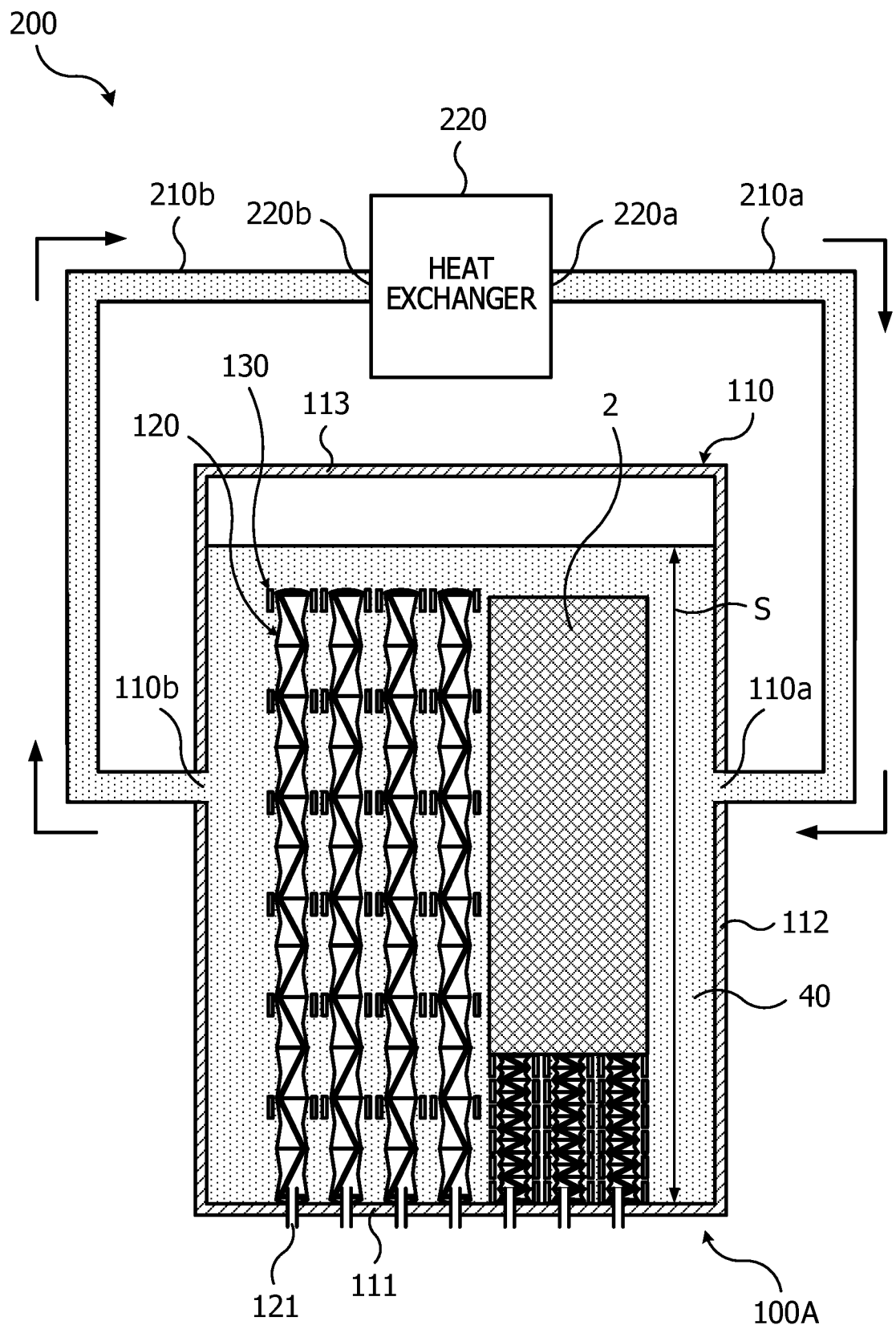
FIG. 21 illustrates an example of an immersion cooling device according to an eighth embodiment.

FIG. 21 illustrates an example of an immersion cooling device according to an eighth embodiment. FIG. 21 illustrates the structure of the example of the immersion cooling device.

An immersion cooling device 200 illustrated in FIG. 21 includes, for example, the immersion tank 100A as described according to the second embodiment. The tank main body 110 of the immersion tank 100A has an inlet 110a and an outlet 110b for the coolant 40. The electronic device 2 is immersed in the coolant 40 stored in the tank main body 110. The air bags 120 over which the electronic device 2 is installed are each deflated while being guided by the guide units 130, and the air bags 120 over which the electronic device 2 is not provided (or the electronic device 2 has not been installed yet) are each inflated while being guided by the guide units 130.

A pipe 210a and a pipe 210b are respectively coupled to the inlet 110a and the outlet 110b provided in the tank main body 110. The pipe 210a coupled to the inlet 110a is coupled to an outlet 220a, for the coolant 40, of a heat exchanger 220 that is one of cooling devices that cools the coolant 40. The pipe 210b coupled to the outlet 110b is coupled to an inlet 220b, for the coolant 40, of the heat exchanger 220. The inlet 110a and the pipe 210a function as a channel through which the coolant 40 is fed from the heat exchanger 220 to the tank main body 110. The outlet 110b and the pipe 210b function as a channel through which the coolant 40 is fed from the tank main body 110 to the heat exchanger 220.

In the immersion cooling device 200, the comparatively low-temperature coolant 40 that has been cooled by the heat exchanger 220 passes through the pipe 210a and is supplied into the tank main body 110 through the inlet 110a. Heat generated by the electronic device 2 is transferred to the coolant 40 supplied into the tank main body 110 through the inlet 110a. Thus, the electronic device 2 is cooled. The comparatively high-temperature coolant 40 to which the heat generated by the electronic device 2 has been transferred is discharged to the outside of the tank main body 110 through the outlet 110b and fed to the heat exchanger 220 through the pipe 210b. The comparatively high-temperature coolant 40 having fed to the heat exchanger 220 is cooled by the heat exchanger 220. Then, the coolant 40 having been cooled by the heat exchanger 220 is fed to the tank main body 110 again through the pipe 210a. In the immersion cooling device 200, as described above, the coolant 40 is circulated while being cooled by the heat exchanger 220. Thus, the electronic device 2 installed in the tank main body 110 is continuously cooled.

In the immersion tank 100A, displacement of the liquid height S of the coolant 40 in the tank main body 110 is suppressed by inflation of the air bags 120 and deflation of the air bags 120 when the electronic device 2 is installed. As a result, additional supply and discharge of the coolant 40, the increase in the size of the tank main body 110, the increase in the amount of the coolant 40 usage, and so forth may be suppressed, and the electronic device 2 installed in the tank main body 110 may be sufficiently cooled. With the immersion tank 100A as described above, the immersion cooling device 200 exhibiting good performance for cooling the electronic device 2 may be realized. The immersion cooling device 200 as described above may be used, for example, for cooling electronic devices included in a computer system such as a super computer or a high-performance computer heat generation density and mounting density of which are comparatively high.

Although the immersion tank 100A described according to the second embodiment is used as an example, the immersion tank 1, 100B, 100C, 100D, 100E, 100F, 100Fa, 100Fb, or the like described according to the first and third to seventh embodiments is able to be used to realize the immersion cooling device similar to the above-described immersion cooling device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An immersion tank comprising:
   a tank main body configured to store a coolant;
   at least one first air bag that is provided in the tank main body, that is coupled to a bottom portion of the tank main body, that is able to be inflated toward an upper portion of the tank main body, and that is able to be deflated, from an inflated state thereof, toward the bottom portion;
   a guide member that is provided outside the at least one first air bag in the tank main body and that is configured to guide the at least one first air bag during the inflation and the deflation of the at least one first air bag; and
   a support unit that is provided in the at least one first air bag and that is configured to support the at least one first air bag against a pressure of the coolant,
   the at least one first air bag and the guide member are provided at a location where an electronic device to be immersed in the coolant is to be installed in the tank main body,
   the at least one first air bag is deflated from the inflated state thereof when the electronic device is installed, and
   the guide member ascends as the at least one first air bag is inflated, and the guide member descends as the at least one first air bag is deflated.

2. The immersion tank according to claim 1, further comprising a first urging unit that is provided in the at least one first air bag and that is configured to urge the at least one first air bag toward the upper portion.

3. The immersion tank according to claim 1, further comprising:
   a second air bag that is provided outside the tank main body and that communicates with the at least one first air bag; and
   a compression unit that is provided outside the tank main body and that is configured to compress the second air bag; wherein
   the at least one first air bag is inflated when the second air bag is compressed by the compression unit, and wherein
   the second air bag is inflated against compression applied by the compression unit when the at least one first air bag is deflated.

4. The immersion tank according to claim 1, further comprising a second urging unit that is configured to urge the guide member toward the upper portion.

5. The immersion tank according to claim 1, further comprising an adjustment unit configured to adjust an upper end position of the at least one first air bag before the electronic device is installed to a position lower than an upper end position of the at least one first air bag that is inflated to a maximum.

6. The immersion tank according to claim 1, wherein the at least one first air bag in the inflated state occupies in the coolant a volume corresponding to the electronic device to be installed.

7. The immersion tank according to claim 1, wherein
   the at least one first air bag includes a plurality of first air bags, and wherein
   the plurality of first air bags are provided at the location where the electronic device is to be installed in the tank main body.

8. The immersion tank according to claim 1, wherein
   the at least one first air bag includes a plurality of first air bags, and wherein
   the guide member includes a partition that is provided at a position outside the plurality of first air bags and between the plurality of first air bags adjacent to each other.

9. The immersion tank according to claim 7, wherein the plurality of first air bags, in a state in which at least one of the plurality of first air bags is in an inflated state, occupy in the coolant a volume corresponding to the electronic device to be installed.

10. An immersion cooling device comprising:
    an immersion tank that includes
    a tank main body configured to store a coolant,
    a first air bag that is provided in the tank main body, that is coupled to a bottom portion of the tank main body, that is able to be inflated toward an upper portion of the tank main body, and that is able to be deflated, from an inflated state thereof, toward the bottom portion, and
    a guide member that is provided outside the first air bag in the tank main body and that is configured to guide the first air bag during the inflation and the deflation of the first air bag;
    a first channel configured to allow the coolant to be supplied therethrough into the tank main body;
    a second channel configured to allow the coolant to be discharged therethrough from the tank main body;
    a cooling device configured to cool the coolant discharged through the second channel and feed the coolant discharged through the second channel to the first channel; and
    a support unit that is provided in the at least one first air bag and that is configured to support the at least one first air bag against a pressure of the coolant,
    the at least one first air bag and the guide member are provided at a location where an electronic device to be immersed in the coolant is to be installed in the tank main body,
    the at least one first air bag is deflated from the inflated state thereof when the electronic device is installed, and the guide member ascends as the at least one first air bag is inflated, and the guide member descends as the at least one first air bag is deflated.

* * * * *